United States Patent
Iwasaki

(10) Patent No.: US 11,836,833 B2
(45) Date of Patent: Dec. 5, 2023

(54) IMAGE CREATION APPARATUS, METHOD AND PROGRAM, AND VIRTUAL FITTING SYSTEM

(71) Applicant: KABUSHIKI KAISHA KITEMIRU, Tokyo (JP)

(72) Inventor: Kyoji Iwasaki, Tokyo (JP)

(73) Assignee: KABUSHIKI KAISHA KITEMIRU, Tokyo (JP)

(*) Notice: Subject to any disclaimer, the term of this patent is extended or adjusted under 35 U.S.C. 154(b) by 29 days.

(21) Appl. No.: 17/522,976

(22) Filed: Nov. 10, 2021

(65) Prior Publication Data
US 2022/0067999 A1    Mar. 3, 2022

Related U.S. Application Data

(63) Continuation of application No. PCT/JP2020/018744, filed on May 8, 2020.

(30) Foreign Application Priority Data

May 11, 2019    (JP) ................. 2019-090260

(51) Int. Cl.
G06T 11/60    (2006.01)
G06T 3/40     (2006.01)

(52) U.S. Cl.
CPC ............ *G06T 11/60* (2013.01); *G06T 3/40* (2013.01); *G06T 2200/24* (2013.01)

(58) Field of Classification Search
CPC .................... G06T 11/60; G06T 3/40
See application file for complete search history.

(56) References Cited

U.S. PATENT DOCUMENTS 6,546,309 B1 *   4/2003   Gazzuolo ............... G06T 17/20
                                                    702/167
9,256,974 B1 *   2/2016   Hines ..................... H04N 13/282
(Continued)

FOREIGN PATENT DOCUMENTS

JP    H09-44556 A     2/1997
JP    H10-340282 A    12/1998
(Continued)

OTHER PUBLICATIONS

International Search Report and Written Opinion from International Patent Application No. PCT/JP2020/018744, dated Jun. 16, 2020.
(Continued)

*Primary Examiner* — Phi Hoang
(74) *Attorney, Agent, or Firm* — Potomac Law Group, PLLC

(57) ABSTRACT

A technique for displaying a "sense of length" in each case where users having different heights and/or body shapes wear clothing of various designs and/or sizes is presented. An image creation apparatus includes a setting unit configured to set a clothing image data having size information of clothing that is superimposed on a human body image data having height information and body shape information of a human body; a modifying unit configured to modify the human body image data or the clothing image data based on a result of comparing height information or body shape information of a user with the height information or body shape information of the human body image data; and a creating unit configured to superimpose the clothing image data on the human body image data, on an object-by-object basis, based on a reference position dependent on type information of the clothing image data, and create a virtual fitting image data.

20 Claims, 13 Drawing Sheets

(56) References Cited

U.S. PATENT DOCUMENTS

2017/0352092 A1* 12/2017 Mitchell ............... G06T 15/503
2018/0253840 A1*  9/2018 Tran ..................... G16H 40/63
2020/0279440 A1*  9/2020 Aluru ................... G06T 19/20
2022/0351378 A1* 11/2022 Kamiyama ........... G06T 7/0012

FOREIGN PATENT DOCUMENTS

| JP | 2000-003376 A | 1/2000 |
| JP | 2001-273446 A | 10/2001 |
| JP | 2005-122558 A | 5/2005 |
| JP | 3742394 B2 | 2/2006 |
| JP | 2013-008249 A | 1/2013 |
| JP | 2016-024742 A | 2/2016 |
| JP | 2019-510297 A | 4/2019 |
| KR | 2008-0041079 A | 5/2008 |

OTHER PUBLICATIONS

Office Action dated Sep. 9, 2021, in Japanese Patent Application No. 2021-519420.
Office Action dated Dec. 13, 2022, in Japanese Patent Application No. 2022-076782.
Office Action dated Apr. 18, 2023, in Japanese Patent Application No. 2022-076782.

* cited by examiner

Fig. 11
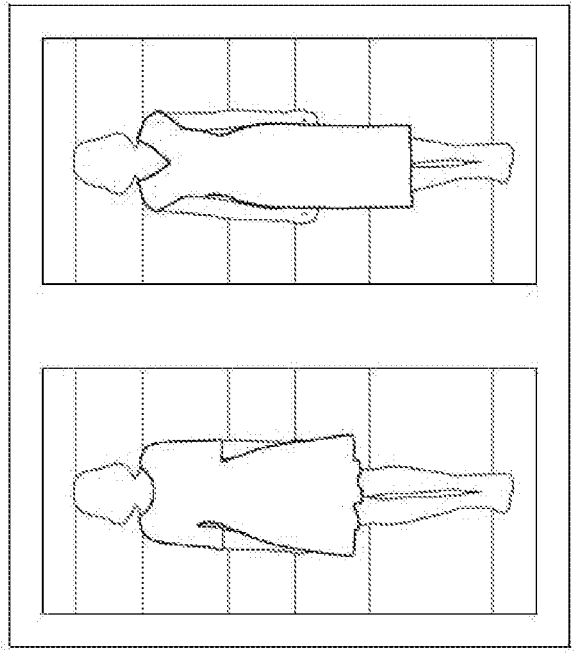
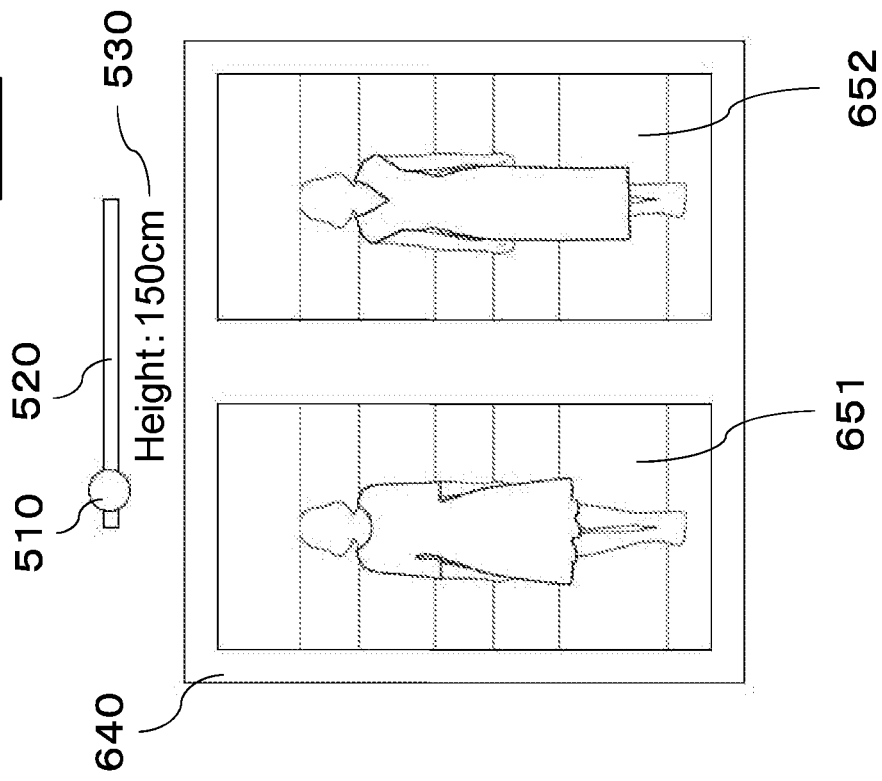

ical Field

IMAGE CREATION APPARATUS, METHOD AND PROGRAM, AND VIRTUAL FITTING SYSTEM

TECHNICAL FIELD

The invention relates to techniques for creating images in which clothes virtually fit users' models having different heights and/or body shapes.

BACKGROUND

A device using two-dimensional models or three-dimensional models has been developed as an image display device that virtually simulates a state in which a human is wearing clothes.

Patent document 1 discloses a virtual fitting display device using two-dimensional models. When a user of the device wishes to virtually put the first clothing on a human body and then virtually put the second clothing on the human body with the first clothing, the device can superimpose the second clothing image on the human body image with the first clothing image, without protruding the first clothing image from the second clothing image.

Patent document 2 discloses a virtual fitting display device using three-dimensional models. The device sets each vertex of a plurality of polygons constituting three-dimensional models of a human body and clothing as mass points. The device also selects points that are not affected by gravity from the mass points of the clothing model, and then sets the selected points as fixed points. The fixed points are the mass points at which the human body model contacts with the clothing model.

The device calculates the effect of gravity operating on each of the mass points of the clothing model based on the fixed points. The movement of the mass points due to the calculated influence of gravity is sequentially corrected by the constraint processing. The clothing model is displayed along the shape of the human body model by the sequential correction.

However, the techniques disclosed in the patent documents 1 and 2 are not possible to virtually simulate a "sense of length" in each case where users having different heights and/or body shapes wear clothing of various designs and/or sizes.

RELATED ART

Patent Documents

Patent document 1: JP 3742394 B2
Patent document 2: JP 2005-122558 A

SUMMARY

Technical Problem

One or more embodiments of the instant invention focus on solving such a problem. An object of the invention is to provide a technique for displaying a "sense of length" in each case where users having different heights and/or body shapes wear clothing of various designs and/or sizes.

Solution to Problem

One of the embodiments is an image creation apparatus. The apparatus includes a setting unit configured to set a clothing image data having size information of clothing that is superimposed on a human body image data having height information and body shape information of a human body; a modifying unit configured to modify the human body image data or the clothing image data, based on a result of comparing height information or body shape information of a user with the height information or body shape information of the human body image data; and a creating unit configured to superimpose the clothing image data on the human body image data, on an object-by-object basis, based on a reference position dependent on type information of the clothing image data, and create a virtual fitting image data.

Another of the embodiments is an image creation method using a computer. The method includes setting a clothing image data having size information of clothing that is superimposed on a human body image data having height information and body shape information of a human body; modifying the human body image data or the clothing image data based on a result of comparing height information or body shape information of a user with the height information or body shape information of the human body image data; and superimposing the clothing image data on the human body image data, on an object-by-object basis, based on a reference position dependent on type information of the clothing image data, and creating a virtual fitting image data.

Another of the embodiments is an image creation program executed by a computer. The program includes a step of setting a clothing image data having size information of clothing that is superimposed on a human body image data having height information and body shape information of a human body; a step of modifying the human body image data or the clothing image data based on a result of comparing height information or body shape information of a user with the height information or body shape information of the human body image data; and a step of superimposing the clothing image data on the human body image data, on an object-by-object basis, based on a reference position dependent on type information of the clothing image data, and creating a virtual fitting image data.

Another of the embodiments is a virtual fitting system. The system includes a setting unit configured to set a clothing image data having size information of clothing that is superimposed on a human body image data having height information and body shape information of a human body; a modifying unit configured to modify the human body image data or the clothing image data based on a result of comparing height information or body shape information of a user with the height information or body shape information of the human body image data; a creating unit configured to superimpose the clothing image data on the human body image data, on an object-by-object basis, based on a reference position dependent on type information of the clothing image data, and create a virtual fitting image data; and a displaying unit configured to display the virtual fitting image data.

Advantage

One or more embodiments provide a technique for displaying a "sense of length" in each case where users having different heights and/or body shapes wear clothing of various designs and/or sizes.

BRIEF DESCRIPTION OF DRAWINGS

FIG. 11 is a diagram of a result of processes of the virtual fitting system in accordance with the third embodiment (No. 2: PC screen).

DETAILED DESCRIPTION OF EMBODIMENTS

Figure 1:
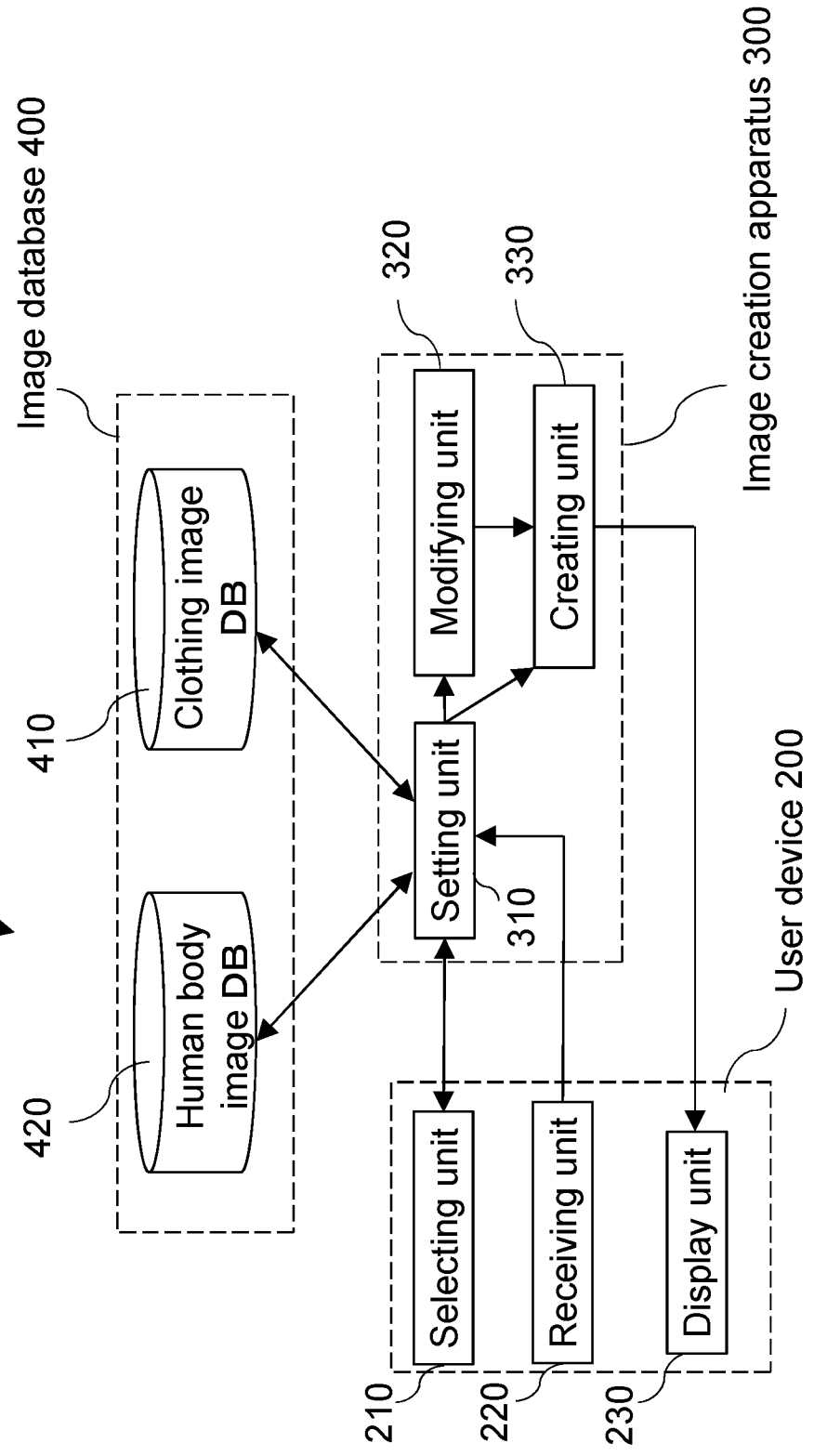
FIG. 1 is a block diagram of a virtual fitting system in accordance with one or more embodiments.

One or more embodiments of the invention are described with reference to the drawings. The same reference numerals are given to common parts in each figure, and duplicate description is omitted.

(Structural Elements of One or More Embodiments)

FIG. 1 is a block diagram of a virtual fitting system in accordance with one or more embodiments. The virtual fitting system 100 includes a user device 200, an image creation apparatus 300 and an image database 400. The user device 200 inputs information such as clothing that a user of the system 100 wishes to try on and displays a virtual fitting image. The image creation apparatus 300 creates the virtual fitting image based on the input information of the user device 200 and sends the virtual fitting image to the user device 200. The image database 400 stores data that are necessary for the image creation apparatus 300 to create the virtual fitting image.

The user device 200 includes a selecting unit 210, a receiving unit 220 and a display unit 230. The selecting unit 210 receives (or accepts) a selection made by the user from a plurality of human body image data (hereinafter referred to as "human body image") and/or clothing image data (hereinafter referred to as "clothing image") that are displayed in a way of being able to be selected. The receiving unit 220 receives information that the user has input the user's height and/or body shape and the user's size of clothing. The display unit 230 displays a virtual fitting image. An average human body image serves as a reference for superimposing the clothing image. The average human body image is expanded or contracted based on the user's height and/or body shape. The selected clothing image is expanded or contracted based on the user's size of clothing. The virtual fitting image is a virtual image fitting image data that is the expanded or contracted clothing image superimposed on the expanded or contracted human body image.

The user device 200 may be realized by a PC (Personal Computer) running a web browser. The user device 200 displays website screens related to the virtual fitting system in accordance with the embodiments, inputs information related to virtual fitting, and creates a virtual fitting image. The user device 200 may also be realized by downloading and installing the application software related to the virtual fitting system to a mobile information terminal device such as a smartphone. Furthermore, the user device 200 may be a terminal device dedicated to the virtual fitting system.

The image creation apparatus 300 includes a setting unit 310, a modifying unit 320 and a creating unit 330. The setting unit 310 sends information relating to a plurality of clothing images and an average human body image that has not been superimposed on the clothing image yet to the user device 200. The modifying unit 320 receives information relating to the clothing image and the average human body image that are selected by the user device 200 from the setting unit 310, sets a reference position based on a type of the clothing image, and modifies the average human body image and the clothing image based on information relating to the user's height and/or body shape received from the user device 200. The creating unit 330 superimposes the modified clothing image on the modified human body image and creates the virtual fitting image.

The image creation apparatus 300 may be implemented on a computer as software, and the form of the implementation is not limited. For example, the apparatus 300 may be implemented as an image creation program installed on a dedicated server connected to a user device and a wired or wireless communication link (Internet connection, etc.), or the apparatus 300 may be implemented using a so-called cloud service.

The image database 400 includes a clothing image database DB 410 that stores a plurality of clothing images, and a human body image database DB 420 that stores a plurality of average human body images. The average human body images are also called the reference human body images or the standard human body images.

The clothing image DB 410 manages the clothing images, the clothing type information, the clothing size information, and the reference position of the clothing, using the clothing identification information (clothing ID). The reference position of the clothing is a guide for expanding or contracting the virtual fitting image that is the clothing image superimposed on the average human body image.

The clothing type information refers to types of clothing such as skirts and blouses. The clothing size information represents a size of the clothing and numerical information necessary for calculating changing the size into other sizes. As described above, it may be necessary to prepare one size (such as M size) of each clothing image, and it may not be necessary to prepare other sizes (such as S size or L size) of the clothing image. The initial settings (also referred to as "default settings") of the embodiments represent that the size of the clothing is M size. Furthermore, the numerical information that is required for calculating changing the size into other sizes is the total length of each of the S, M, and L sizes of the clothing.

In the embodiments, "Information relating to clothing images" includes clothing IDs, clothing images, type information of clothing, size information of clothing, and reference positions of clothing. Furthermore, an example of the data stored in the clothing image DB 410 is described when the reference position is described later.

The human body image DB 420 manages average human body images, the type information of the average human body images, the height information of the average human bodies, and the body shape information of the average human bodies, using the human body identification information (human body ID). The type information of the average human body image indicates whether it is a mannequin image, an actual human image (for example, a female model image), or a display of only outline of human body. As described above, the average human body image may be prepared for one image of an actual human whose height is known in advance (for example, a model image of a female being 160 cm tall). In addition, the body shape information of this female model being 160 cm tall is "normal type of body".

When average human body images include an average mannequin image and/or an outline of human body, it may be necessary to prepare one type (such as "normal type of body" being 160 cm tall) of each of the average mannequin image and/or the outline of human body, and it may not be necessary to prepare other types (such as "thin type of body" or "fat type of body") of each of the average mannequin image and/or the outline of human body.

The human body image DB 420 also manages scale image data (hereinafter referred to as "scale image"). It may be sufficient to prepare one type of image of known height for the human body image and one type of image of known size for the clothing image, whereas it may be necessary to prepare several types of images according to heights for the scale image. In the embodiments, five types of scale images having a height of 150 cm, 155 cm, 160 cm, 165 cm, and 170 cm are created in advance and stored in the human body image DB 420.

Figure 2:
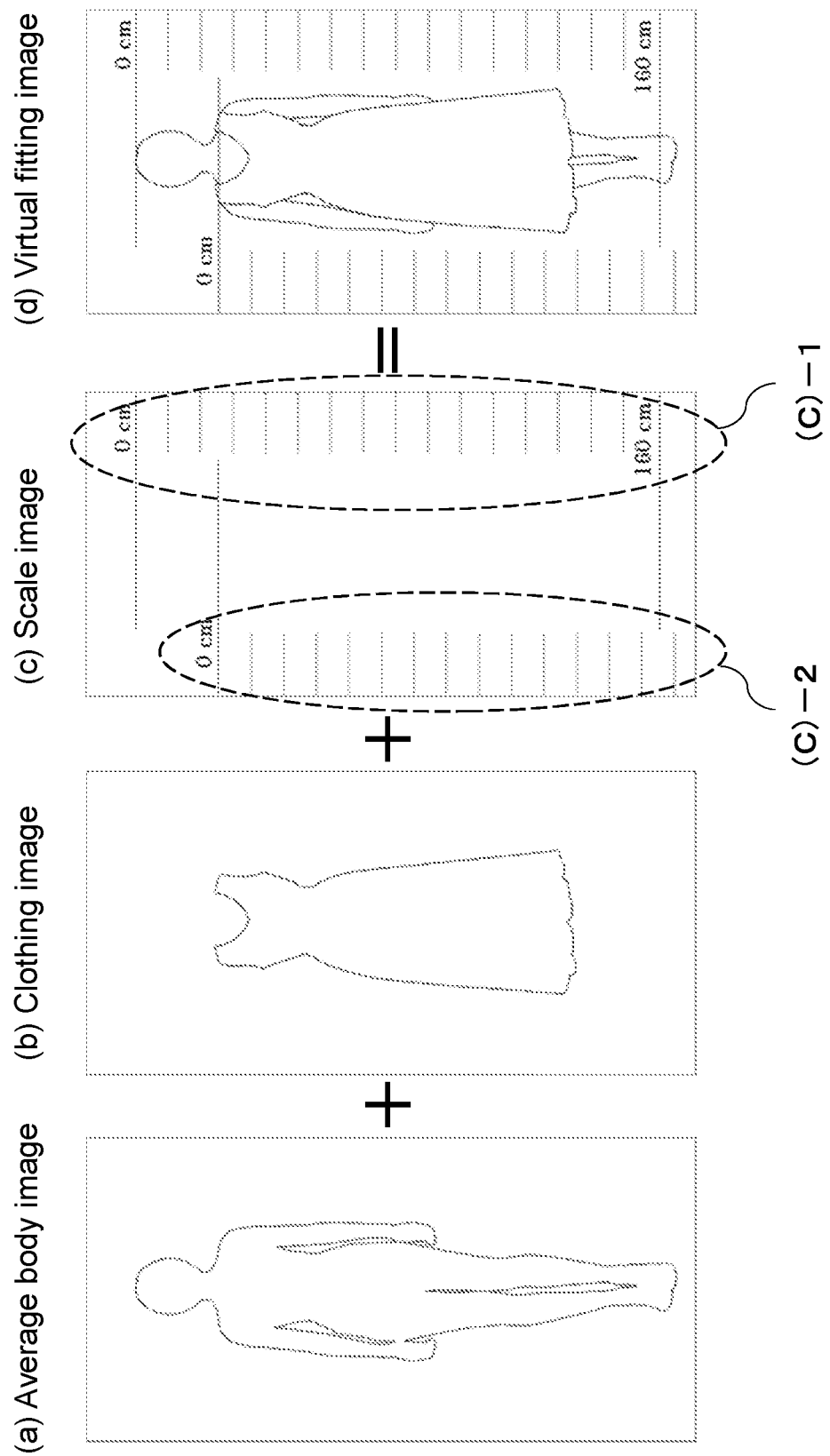
FIG. 2 is an explanatory diagram of each image.

FIG. 2 is an explanatory diagram of each image. FIG. 2 (*a*) shows an average human body image as an outline. FIG. 2 (*b*) shows a clothing image (sleeveless one-piece dress). FIG. 2 (*c*) represents a scale image, and FIG. 2 (*d*) shows a virtual fitting image (also referred to as a "display image") after overlaying each of the images. FIG. 2 illustrates the case of the default settings (An average body image is 160 cm tall and a clothing image is M size clothing). FIG. 2 (*d*) shows a virtual fitting image that is the clothing image (M size) superimposed on the average body image (height 160 cm). FIG. 2 (*d*) also shows that the scale image (when the height is 160 cm) is superimposed on the virtual fitting image.

The scale image data shown in FIG. 2 (*c*) stores information of metric scale per 10 cm. The scale information of the height of the average human body image being 160 cm (shown in dotted line (c)-1) stores scale marks that indicates from the head position (as 0 cm) to the foot position (as 160 cm) per 10 cm. When the clothing image shown in FIG. 2 (*b*) is a one-piece dress, the reference position of the clothing image is set as the shoulder position. The scale information of the length of the clothing image stores scale mark data (shown in dotted line (c)-2) that indicates from the reference position (as 0 cm) to the bottom of the scale image per 10 cm. The user can browse such a display image (shown in FIG. 2 (*d*)) on the website screen.

In the embodiments, the scale information of the human body image and the clothing image is imaged as the scale image shown in FIG. 2 (*c*). But it may not necessarily be an image data. The creating unit 330 may draw scale lines of the scale information and may change numbers of the scale lines.

The creation unit 330 may change the numerical value of the height and the distance between the scale lines (shown in dotted line (c)-1), using the numerical information of the height. Furthermore, the change of the distance between the scale lines below the shoulder (shown in dotted line (c)-2) may be calculated by "height×(times) coefficient". In this way, instead of fixing the scale information on an image file (such as JPEG file format), it is possible to generate scale information (scale lines and their numerical values) by changing the numerical value of the height and the distance between the scale lines.

If the scale information is fixed on an image data, the following problem occurs. When the numerical value of the height is entered by 1 cm or is smoothly increased or decreased with a slide bar, it is necessary to read another new scale image data each time the numerical value of the height is changed. Therefore, the data traffic is busy and the display speed of the user device 200 is delayed. On the other hand, instead of using the scale image data, the method of changing the scale lines and the numerical values of the scale information can avoid decreasing the display speed.

If the width of the human body image is width-wise (or laterally) changed when increasing or decreasing the waist of the average human body to fit the waist size of the user, it is possible to keep the layout of the letters representing the numerical values of the scale image because the average human body image in FIG. 2 (*a*) and the scale image in FIG. 2 (*c*) are separated. Furthermore, since the clothing image in FIG. 2 (*b*) and the scale image in FIG. 2 (*c*) are separated, the image deformation associated with changing the size of the clothing (for example, from M size to S size, and from M size to L size) may be performed only on the clothing image.

The body shape information of the human body may be set to three types having "thin type", "normal type" and "fat type", or five types having "thin type", "slightly thin type", "normal type", "slightly fat type" and "fat type". BMI (Body Mass Index) may be input. In the embodiments, "Information relating to average human body image" includes human body IDs, average human body images, type information of average human body image, height information of average human body, and body shape information of average human body. The height information of the average human body may not be essential. In the first embodiment described later, it is necessary that the height information of the average human body is 160 cm. However, in the second embodiment, the height information of the average human body is not necessary.

The image database 400 may be implemented on a dedicated server as a database related to the virtual fitting system, in a similar way of the image creation device 300, or the database 400 may be implemented using a so-called cloud service.

(Example of Operation on the User Device)

An example of operation of the user device 200 is described. Users can select clothing from various clothing images displayed on the display unit 230. A case is described where a woman's sleeveless one-piece dress is selected.

Figure 3:
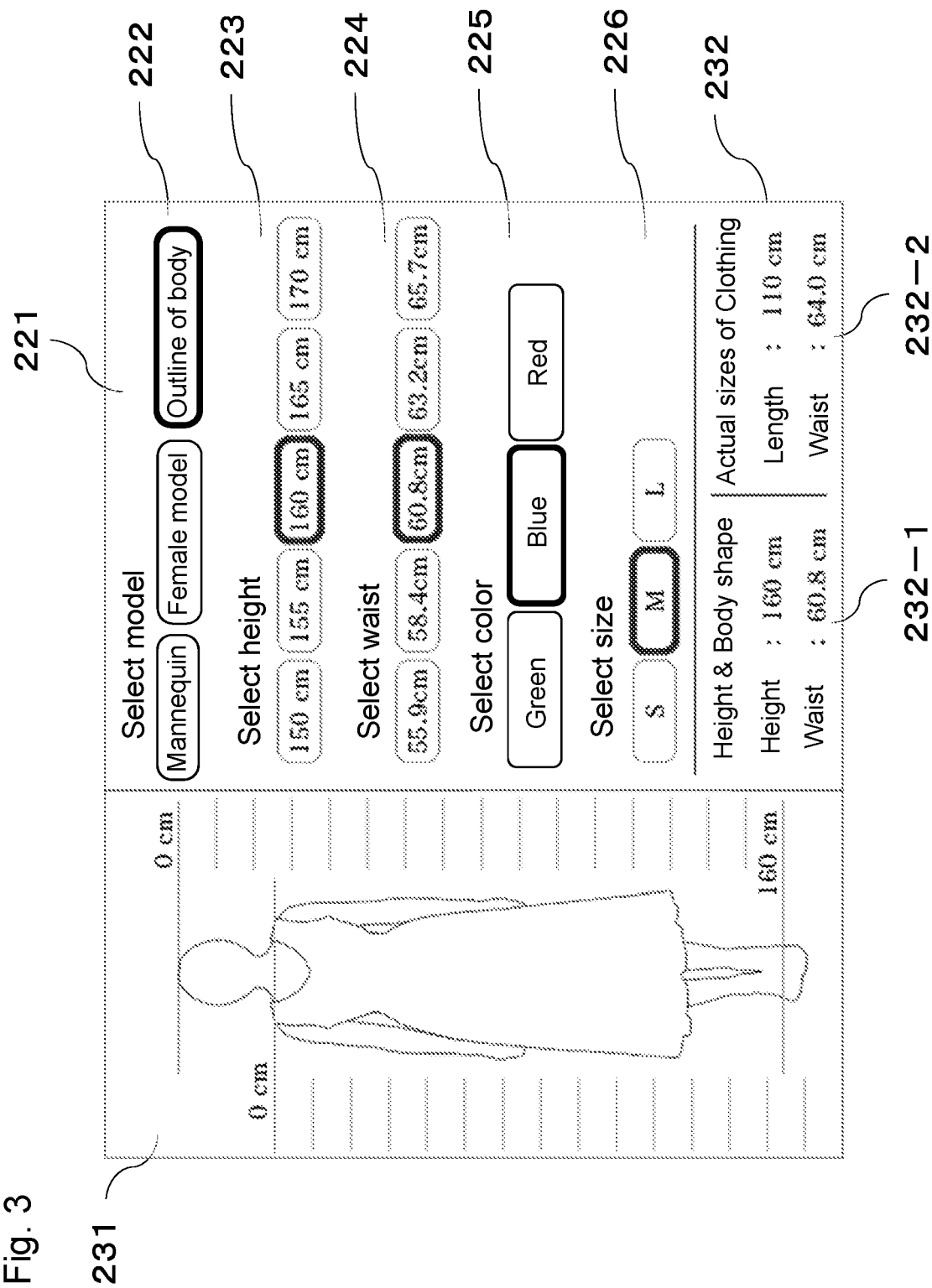
FIG. 3 shows an example of a screen for selecting the height and body shape of a user and the size of clothing.

FIG. 3 shows an example of a screen for selecting the height and body shape of the human body image and the size of the clothing on the user device 200. In FIG. 3, it is described a case where five sizes of waists can be selected, as an example of selecting five types of the body shape.

The window screen 231 is a window screen of the display unit 230 and can display a virtual fitting image. At first, the window screen 231 displays outline of a female body as the default setting of the average human body image. In addition, the clothing image is also displayed as outline, to simplify the drawing.

When a user selects one-piece dress, the image creation device 300 superimposes the one-piece dress image on the female outline image and creates the virtual fitting image. The window screen 231 displays this virtual fitting image.

The window screen 231 displays an image that further superimposes the scale image on the virtual fitting image which is the clothing image superimposed on the average human body image. The scale information of the scale image is scale information of the height of the female and the length of the clothing.

When the height of the female model is 160 cm, the height scale information is drawn with horizontal lines every 10 cm between 0 cm and 160 cm. In the case of M size one-piece dress, the length scale information is set to 0 cm at the shoulder position, and horizontal lines are drawn every 10 cm to the bottom of the screen.

Superimposing the one-piece dress image and the scale image on the female outline image creates the virtual fitting image with the scale information. The reference position, which serves as a guide for placing the clothing image on the average human body image, is described later.

In this way, each image data may be saved in a transparent file format, such as PNG (Portable Network Graphics) format, to superimpose each image data.

If the clothes are pants, the scale information attached to the pants image will be the inseam scale information. An example of the inseam scale mark is indicated every 10 cm between 0 cm and 80 cm.

The window screen 221 is a window screen of the receiving unit 220. The window screen 221 displays "select model" buttons 222, "select height" buttons 223, "select waist" buttons 224, "select color" buttons 225, and "select size" button 226.

In FIG. 3, when the user is a woman, the "select model" buttons 222 may select "mannequin", "female model", and "outline of body". "Outline of body" is selected by default.

The "select height" buttons 223 may select from the heights being every 5 cm between 150 cm and 170 cm. "160 cm" is selected by default.

The "select waist" buttons 224 may select from five types of waists according to the height. Since the initial height setting is "160 cm", the five types of waists that may be selected from are "55.9 cm", "58.4 cm", "60.8 cm", "63.2 cm", and "65.7 cm". The five types of waists are corresponding to "thin type", "slightly thin type", "normal type", "slightly fat type", and "fat type" from the left. In FIG. 3, "60.8 cm", which is the middle button (corresponding to "normal type"), is selected as the initial setting of the body shape.

A method of calculating waists is described. The reference waist is the value multiplied the height by a coefficient of 0.38. When the height is 160 cm, the reference waist is 60.8 cm. The numerical value of each button is a value multiplied the reference waist by 0.92, 0.96, 1.00, 1.04, and 1.08 from the left. That is to say, the first button from the left (corresponding to "thin type") is "55.9 cm", the second button (corresponding to "slightly thin type") is "58.4 cm", the third button (corresponding to "normal type") is "60.8 cm", the fourth button (corresponding to "slightly fat type") is "63.2 cm", and the fifth button (corresponding to "fat type") is "65.7 cm". "60.8 cm" corresponding to the "normal type" is selected as the initial setting of the reference waist.

Numerical values of the "select waist" buttons 224 are calculated each time the user selects one of the "select height" buttons 223, and new numerical values of the "select waist" buttons 224 are displayed. The user may also select other new numerical values. For example, when the user selects the leftmost button of the "select waist" buttons 224 (shown as 55.9 cm in FIG. 3), the width of the female outline image and the clothing image shown on the window screen 231 is changed to "92%". Then, when one of the "select height" buttons 223 is pressed and the height changes, all of the "select waist" buttons 224 display new numerical values. However, since the leftmost button of the "select waist" buttons 224 is selected, the width ratio of the female outline image of the window screen 231 is maintained as "92%".

The "select color" buttons 225 can select from "green", "blue" or "red". In FIG. 3, "blue" is selected.

The "select size" buttons 226 can select the size of the clothing from "S", "M", and "L". In FIG. 3, "M" size is selected.

The window screen 232 is a window screen of the display unit 230 and displays the body shape 232-1 and the actual sizes of the clothing 232-2 selected by the user. In FIG. 3, the body shape is displayed as "Height: 160 cm" and "Waist: 60.8 cm". The actual sizes of the clothing are displayed as "Length: 110 cm" and "Waist: 64.0 cm", when the clothing is a one-piece dress. The actual sizes of clothing are not a set of standard measures according to which clothing are produced and sold such as M size, but the sizes of the clothing being actually measured. The actual sizes of clothing are concrete numerical values such as a length and a waist. The actually measured sizes may be measured in a state where the clothing is laid flat or may be measured in a state where the clothing is worn (a state in which the thickness of the human body is taken into consideration).

When the user selects each button on the window screen 221, the receiving unit 220 receives information relating to the height and body shape of the user and the color and size of the clothing and transmits the information to the image creation apparatus 300. The image creation apparatus 300 expands or contracts the average human body image according to the height and body shape of the user, and also changes the clothing image according to the color of the clothing, and expands or contracts the clothing image according to the size of the clothing. Then, overlaying these images creates a virtual fitting image. The window screen 231 displays this virtual fitting image.

As shown in FIG. 3, the user compares the body shape 232-1 selected by the user with the actual sizes 232-2 of the clothing, and further looks at the virtual fitting image 231. Therefore, the user can compare the user's body shape (height and waist) with the body shape (length and waist) of the clothing.

Displaying only the actual sizes of clothing 234-2 has also been performed in conventional electronic commerce. However, the method of measuring lengths of clothes differs depending on each design of the clothes. The method is difficult for users to understand. Therefore, users need to refer to web sites explaining sets of the standard measures and remeasure the user's body shape according to one of the sets of the standard measures. According to the embodiment, users can compare and verify whether or not the actual sizes of clothing 232-2 are suitable for the users without needing to remeasure.

Figure 4:
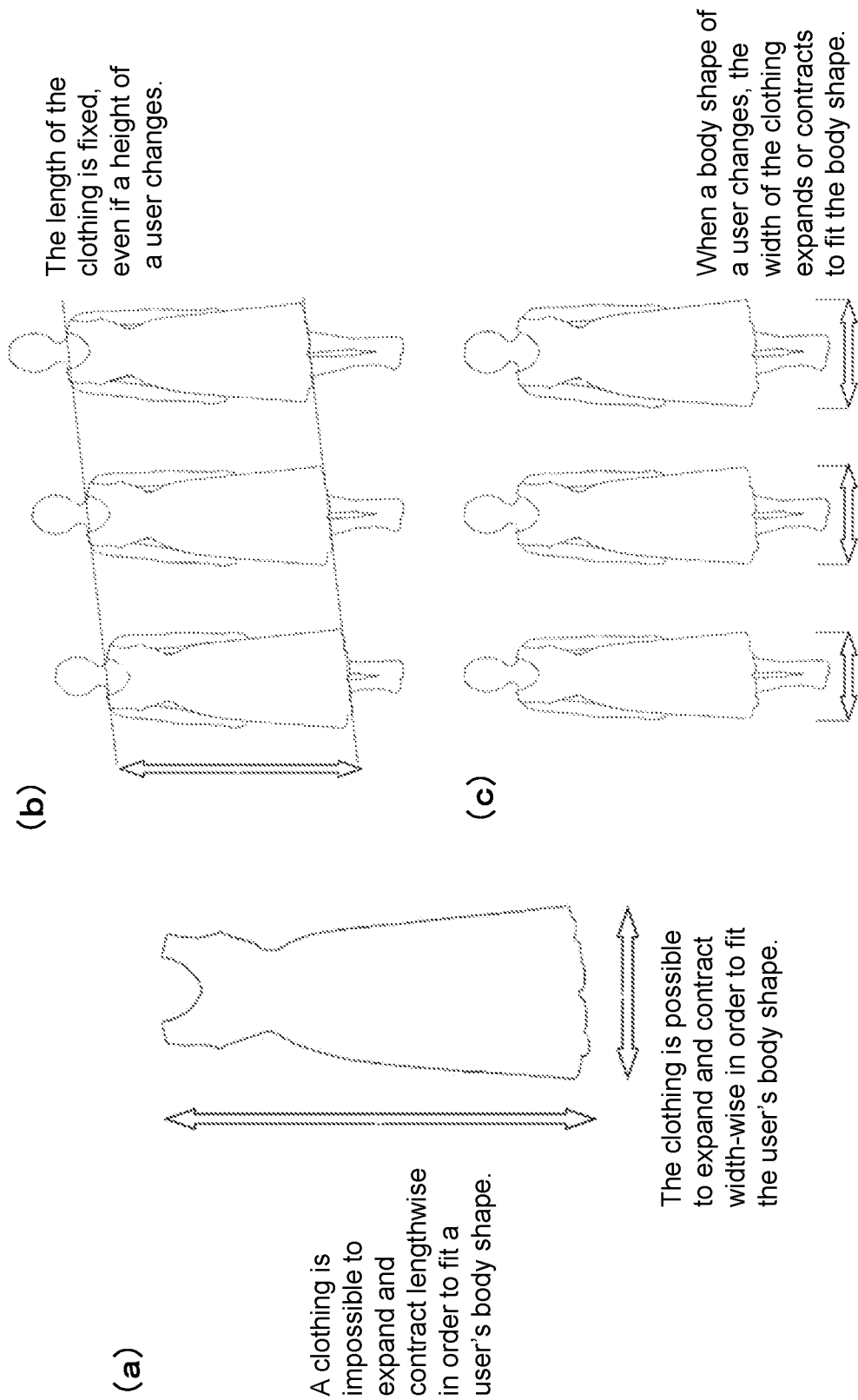
FIG. 4 shows a method of expanding or contracting a virtual fitting image in which a clothing image is superimposed on an average human body image.

FIG. 4 shows a method of expanding or contracting a virtual fitting image in which a clothing image is superimposed on an average human body image. FIG. 4 (*a*) shows a direction in which the clothing (one-piece dress) expands (or enlarges) and contracts (or reduces), and the other direction in which the clothing does not expand and contract.

That is to say, the clothing does not expand or contract length wise (or longitudinally or vertically), according to the height of the user. On the other hand, the clothing expands and contracts in the lateral direction (or width-wise), according to the user's body shape.

FIG. 4 (b) shows that the clothing image does not expand or contract even if the human body image expands or contracts in the vertical direction. The height of the human body image on the right side is higher than that of the average human body image in the center, but that the length of the clothing image is not extended. It can be also seen that the height of the human body image on the left side is shorter than that of the average human body image in the center, but that the length of the clothing image is not shortened. Therefore, the three positions of the hem (or the lower edge) of the one-piece dress are different in the three virtual fitting images. The position of the hem on the right side (tall human) is higher than that on the center (middle human), while the position of the hem on the left side (short human) is lower than that on the center. As described above, the virtual fitting image may be at least the clothing image of FIG. 2 (b) overlaid on the average human body image of FIG. 2 (a) on an object-by-object basis. Users can check the position of the hem of the one-piece dress without overlaying the scale image of FIG. 2 (c) on the virtual fitting image.

FIG. 4 (c) shows that the clothing image expands and contracts width-wise (or laterally) as the human body image expands and contracts width-wise (that is, depending on whether the body shape is "fat type or "thin type"). The human body image on the right side is fatter than the average human body image in the center, and that the width of the clothing image on the right side is extended. It can also be seen that the human body image on the left side is thinner than the average human body image in the center, and the width of the clothing image is contracted.

Figure 5:
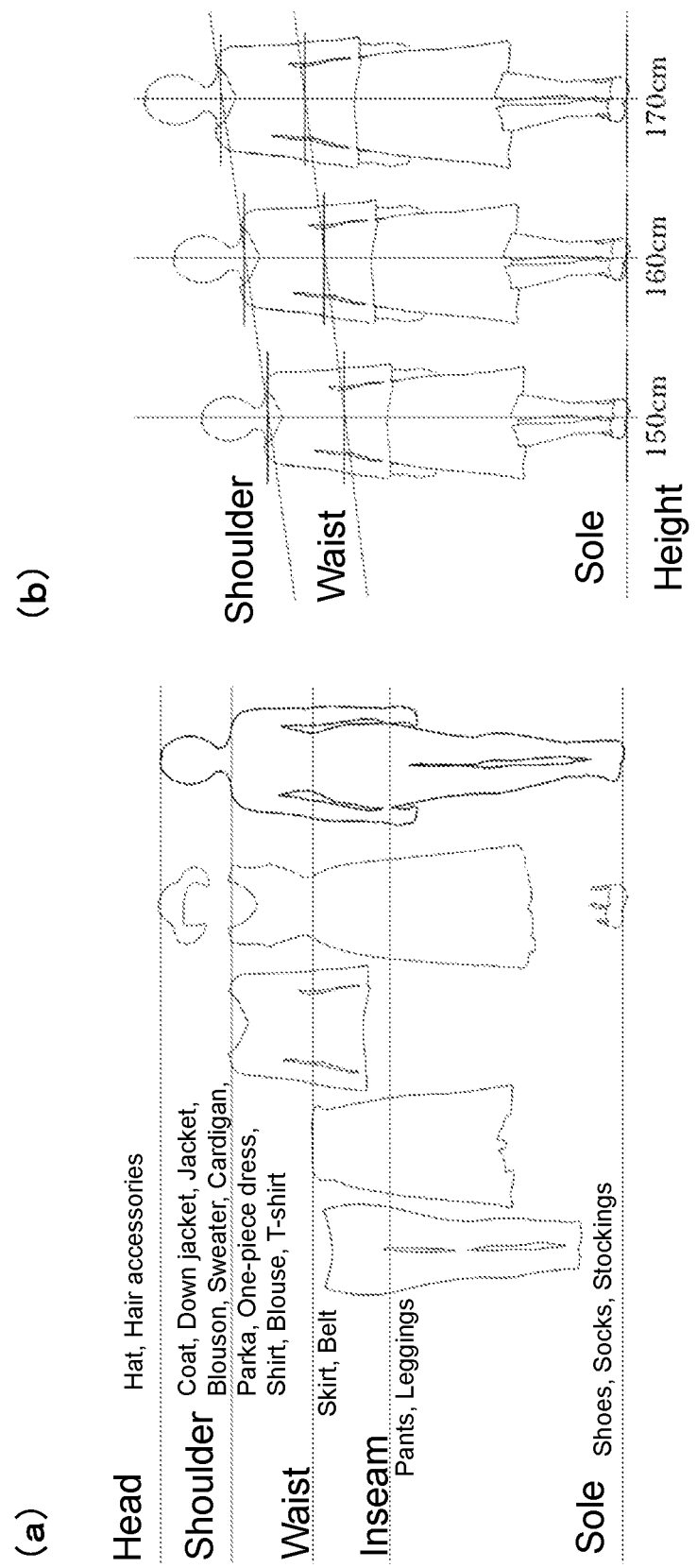
FIG. 5 is an explanatory diagram of a reference position as a guide for placing a clothing image, when a virtual fitting image is created by expanding or contracting an average human body image and the clothing image and superimposing them.

FIG. 5 is an explanatory diagram of a reference position as a guide for placing a clothing image, when a virtual fitting image is created by expanding or contracting an average human body image and the clothing image and superimposing them. FIG. 5 (a) shows that the reference positions differ depending on the types of the clothing. In the embodiments, the reference positions are set at five locations being "head", "shoulder", "waist", "inseam (or inside leg)" and "sole (or soles of someone's feet)".

According to FIG. 5 (a), when the clothing is a blouse, the reference position is set at "shoulder". When the clothing is a skirt, the reference position is set at "waist". The clothing image DB 410 of FIG. 1 stores data in line form. One of the data includes a clothing ID "A", a product "short skirt", a type "skirt", a size "M", a reference position "waist" and image data of the short skirt. Another of the data includes a clothing ID "B", a product "blouse", a type "blouse", a size "M", a reference position "shoulder" and image data of the blouse.

FIG. 5 (b) shows variations of the reference positions due to lengthwise expanding or contracting the human body images. The height (170 cm) of the tall human body image on the right side is higher than that (160 cm) of the average human body image in the center. The positions of the shoulder and waist of the tall human body image are also higher than those of the average human body image. The height (150 cm) of the short human body image on the left side is shorter than that of the average human body image in the center. The positions of the shoulder and waist of the short human body image are also lower than those of the average human body image. In this way, variations of each reference position such as "shoulder" and "waist" are linked to variations of the human body images.

Since "sole" is standard for all heights of the human body images, the heights of "sole" of the human body images are not changed in FIG. 5 (b). The "variations of the reference positions" means a change (or change in height) when "sole" is set as a standard at 0 cm.

In FIG. 5 (b), the waist of the human body image may be expanded or contracted according to the height of the human body image expanding or contracting. In a similar way of calculating the numerical values of the "select waist" buttons 224 in FIG. 3, even if the body shape is the same, the waist expands width-wise as the height expands lengthwise. On the other hand, the waist contracts laterally as the height contracts lengthwise. In this way, the clothing may be expanded or contracted only in the lateral direction according to the expansion and contraction of the waist. It may be necessary to fix the length of the clothing in the vertical direction.

The First Embodiment (Processing Flow 1)

Figure 6:
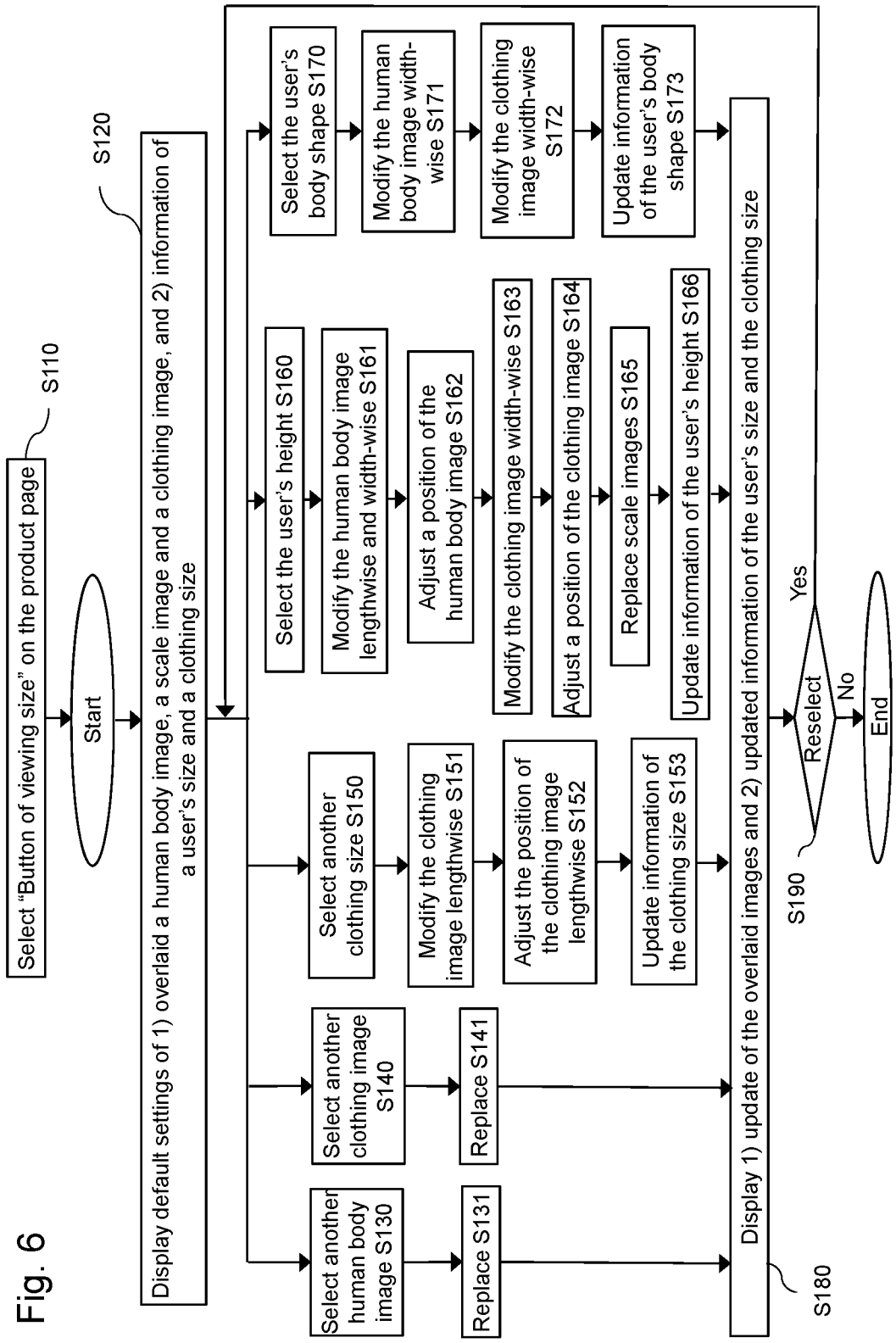
FIG. 6 is a flowchart of processes of the virtual fitting system in accordance with the first embodiment.

FIG. 6 is a flowchart of processes of the virtual fitting system in accordance with the first embodiment. The first embodiment describes a process of creating a virtual fitting image, when the vertical size of the clothing image is maintained, unless the user selects to change the size of the clothing.

First, the user accesses the website of the virtual fitting system in accordance with the first embodiment and selects the "Button of viewing size" on the product page (not shown) of the clothing that the user wishes to wear (S110). When the user selects a one-piece dress from the clothing, the process of creating the virtual fitting image starts.

Processes of the setting unit 310 in the image creation apparatus 300 is described hereinafter, when an outline of female body image is set as a default of the average human body image, shown in FIG. 3. The setting unit 310 acquires "information relating to the average human body image" in the case of an outline of female body image from the human body image DB 420. In the case of the first embodiment, being different from the second embodiment described later, it may be necessary that the height information of the average human body is 160 cm.

The setting unit 310 sends the human body image, the scale image, and the clothing image set as default, to the creating unit 330. The creating unit 330 superimposes the human body image, the scale image, and the clothing image on an object-by-object basis to create the virtual fitting image. The virtual fitting image is created by simply superimposing images of each object. Therefore, the virtual fitting image is different from an irreversible composite image.

The creation of the virtual fitting image performed by the creating unit 330 does not only mean that the creating unit 330 itself superimposes the human body image, the scale image, and the clothing image on an object-by-object basis, but also means that a Web browser on the display unit 230 in the user device that is an external device, generates instruction for superimposing the human body image, the scale image, and the clothing image on an object-by-object basis.

The creating unit 330 also creates information for displaying the user's height information and body shape information set by the setting unit 310 as default, and the clothing size information. The creating unit 330 transmits information for displaying the virtual fitting image and the default user and clothing size information to the user device 200. The display unit 230 in the user device 200 displays the virtual fitting image, the default user height information and body shape information, and the clothing size information (S120).

The virtual fitting image in which the default human body image, the scale image, and the clothing image are superimposed, is that the one-piece dress image and the scale image including the length scale information of the one-piece dress is superimposed on the outline of female body image. The default settings of 1) user height information and body shape information, and 2) clothing size information are the default settings of 1) height (160 cm), height and waist (232-1 in FIG. 3) of body shape (normal type), and 2) the length and waist (232-2 in FIG. 3) of the size of clothing (M size).

The user selects one or more of processes for updating the images and data of the default settings, using the selecting unit 210 and the receiving unit 220. The S130s (from S130 to S131) are update processes when the user selects another human body image. The S140s (from S140 to S141) are update processes when the user selects another clothing images. The S150s (from S150 to S153) are update processes when the user selects another clothing size. The S160s (from S160 to S166) are update processes when the user selects the user's height. The S170s (from S170 to S173) are update processes when the user selects the user's body shape.

The information selected by the selecting unit 210 and the receiving unit 220 is sent to the image creation apparatus 300. The image creation apparatus 300 performs each of the update processes. Then, the information of superimposing and displaying the updated human body image, clothing image, and scale image, and the updated user's height information body shape information and clothing size information, are transmitted to the user device 200. The display unit 230 superimposes and displays the updated human body image, clothing image and scale image, and displays the updated user's height information, body shape information and clothing size information (S180).

The user checks the updated information. When it is necessary for the user to re-select ("Yes" of S190), the user further makes one or more selections (S130, S140, S150, S160 or S170). On the other hand, when it is not necessary for the user to re-select ("No" of S190), the processes of creating the virtual fitting image ends.

Each of the update processes is described. The S130s (from S130 to S131) are update processes when the user selects another human body image. The setting unit 310 acquires information relating to a plurality of average human body images from the human body image DB 420 and transmits the information to the user device 200. The selecting unit 210 of the user device 200 displays a plurality of the human body images on a user screen (for example, a website screen) related to the virtual fitting system and prompts the user to select an average human body image that the user wishes to virtually try on.

The user clicks (or presses) one of the "select model" buttons 222 in FIG. 3 and selects a human body image other than the default female outline image (S130). The information of the human body image selected by the user is transmitted from the receiving unit 220 to the setting unit 310. The setting unit 310 acquires another human body image from the human body image DB 420, based on the information from the receiving unit 220, and exchanges the female outline image for the other human body image (S131).

The S140s (from S140 to S141) are update processes when the user selects another clothing images. When the user selects a color for the one-piece dress image other than the "blue" of the default settings by clicking one of the "select color" buttons 225 in FIG. 3 (S140), the setting unit 310 acquires the other color's one-piece dress image from the clothing image DB 410, based on information from the receiving unit 220. The setting unit 310 exchanges the "blue" one-piece dress image for the other color's one-piece dress image (S141).

The S150s (from S150 to S153) are update processes when the user selects another clothing size. When the user selects a size of the clothing other than the default M size by clicking one of the "select size" buttons 226 in FIG. 3 (S150), the setting unit 310 transfers the information from the receiving unit 220 to the modifying unit 320. The modifying unit 320 modifies the clothing image lengthwise (or longitudinally or in the vertical direction) based on the selected size information (S151). Then, the modifying unit 320 adjusts the modified clothing image lengthwise, to match the shoulder position of the clothing image with the shoulder position of the average human body image (S152). The setting unit 310 updates the "actual sizes of clothing" 232-2 in FIG. 3, using the clothing size information of the clothing image DB 410 (S153). The clothing image modified by the process of S151, and the size information of the clothing updated by the process of S153 are simultaneously displayed by the display process of S180. Therefore, the process of S153 may be executed before the process of S151.

The S160s (from S160 to S166) are update processes when the user selects the user's height. When the user selects a height (the user's height) other than the default 160 cm by using one of the "select height" buttons 223 in FIG. 3 (S160), the setting unit 310 transfers the information from the receiving unit 220 to the modifying unit 320.

The modifying unit 320 modifies the average human body image lengthwise based on the selected height information (S161). When the height information changes, the waist may be recalculated by the waist calculation method described above. When the waist is recalculated, the human body image after being modified lengthwise may be modified width-wise (or laterally) based on the recalculated waist information.

The modifying unit 320 adjusts the position of the modified human body, to place the sole of the foot at the same position as the position before the modification (S162). The modifying unit 320 modifies the clothing image laterally (or width-wise) based on the recalculated waist information (S163). Then, the modifying unit 320 adjusts the modified clothing image, to match the shoulder position of the modified clothing image with the shoulder position of the modified human body image (S164).

The setting unit 310 acquires a new scale image from the human body image DB 420 based on the selected height information and replaces the new scale image with the default scale image (S165). The setting unit 310 also updates "height and body shape" 232-1 in FIG. 3 based on the selected height information (S166). "Height and body shape" 232-1 may be updated by the recalculated waist information.

The S170s (from S170 to S173) are update processes when the user selects the user's body shape. When the user selects a waist other than the default 60.8 cm by clicking one of the "select waist" buttons 224 in FIG. 3 as the user's body shape (S170), the setting unit 310 transfers information from the receiving unit 220 to the modifying unit 320.

The modifying unit 320 modifies the average human body image laterally (or width-wise) based on the selected waist information (S171). The modifying unit 320 also modifies the clothing image laterally (or width-wise) based on the selected waist information (S172). The setting unit 310 also updates the waist of "height and body shape" 232-1 in FIG. 3 (S173).

Clothing that can expand and contract lengthwise when the clothing is worn (for example, stockings, leggings, socks, and top that fit the upper part of body) may be expanded or contracted vertically or laterally according to the expanded or contracted human body image.

(Effect 1)

Figure 7:
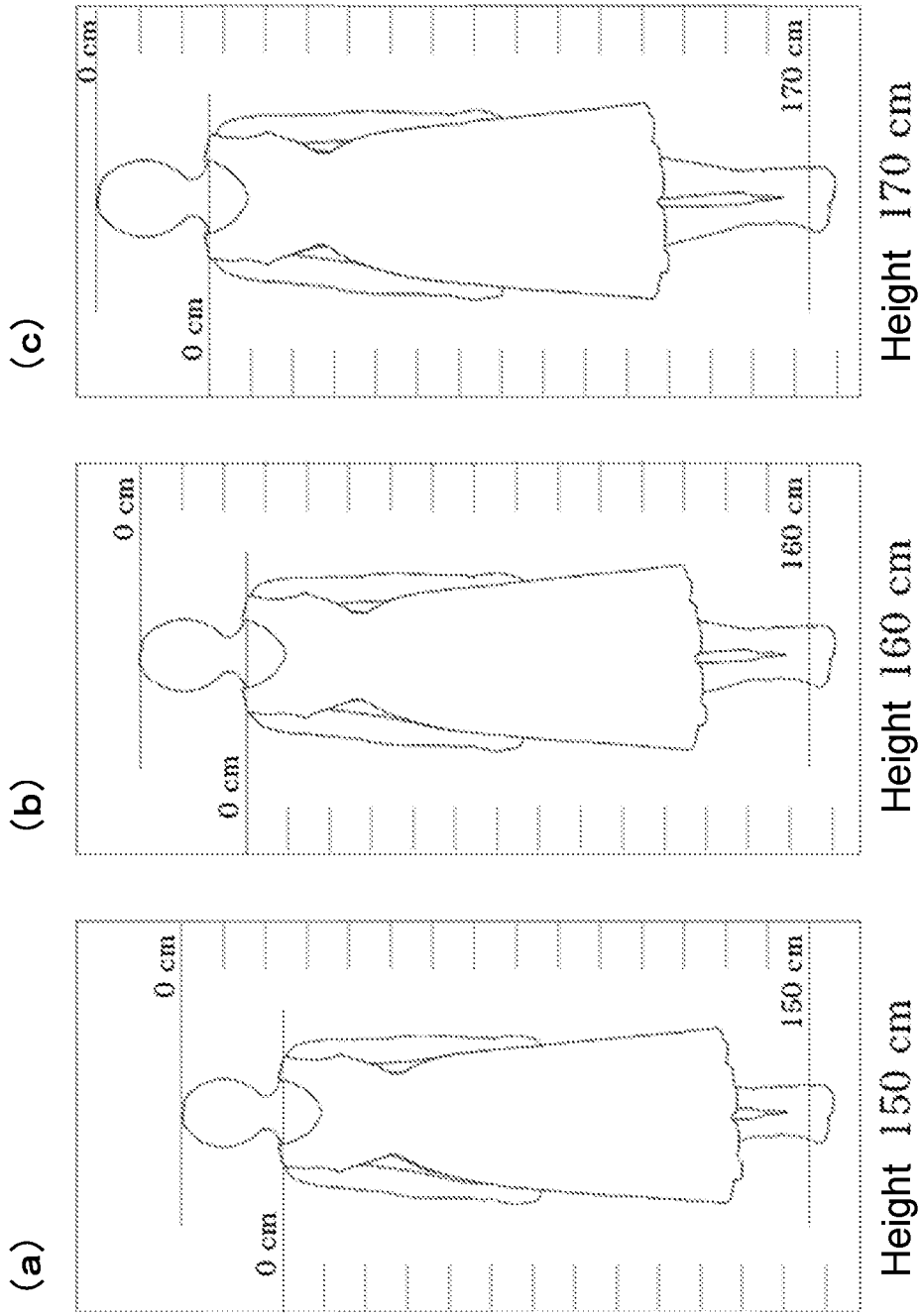
FIG. 7 is a diagram of a result of the processes of the virtual fitting system in accordance with the first embodiment.

FIG. 7 is a diagram of a result of the processes of the virtual fitting system in accordance with the first embodiment. In FIG. 7, the clothing selected by the user is a one-piece dress, the size of the dress is M size, and the length of the dress is 110 cm.

When the height of the average human body image in FIG. 7 (b) is 160 cm, the hem of the dress is around the center of the shin. On the other hand, when the height of the user in FIG. 7 (a) is 150 cm, the hem is lowered to near the ankle. The embodiment can display the "sense of length" when the user virtually wears clothing (such as a dress) of the same size as clothing that a female model or a female mannequin of the human body image virtually wears. A user who is short in stature views the virtual fitting image and can reselect smaller sized clothing.

The "sense of length" of clothing is the "length feeling" that the wearer feels, because the position of the length of the clothing (for example, the length of the skirt) is different when people of different heights wear the clothing of the same size. The "sense of length" may include the "size feeling" that the wearer feels, because the waist position, the button position and the slit position are different when people of different heights wear the clothing of the same size. The feeling of "size" of clothing may include that, for example, in the case of a user whose body shape is larger than the size of clothing, the position of buttons such as the chest and the position of the waist are higher. Users see the "sense of length" of clothing and confirm if (or whether) the design such as the arrangement of buttons and slits of the clothing suits the users' heights and body shapes.

When the height of the user in FIG. 7 (c) is 170 cm, the hem of the dress rises close to the knee. The embodiment can display the "sense of length" when the user virtually wears clothing (such as a dress) of the same size as clothing that a female model or a female mannequin of the human body image virtually wears. A user who is tall in stature views the virtual fitting image and can reselect larger sized clothing.

As described above, according to the virtual fitting system of the embodiment, the window screen 231 of FIG. 3 displays the virtual fitting image of FIG. 7 modified according to the height of the user. The user can confirm if the clothing of the size that the user selects, fits the user's height. The user also checks if the design of the clothing suits the user's height.

Most clothing has properties that the clothing is hard to be modified vertically (even if users' heights are different, the vertical length of the clothing that they wear is almost not changed), while the clothing is easy to be modified laterally (if users' body shapes such as waists change, the clothing spreads width-wise according to the users' body shapes). The virtual fitting system also has an effect that the modification of the virtual fitting image reflects these properties.

There is an electronic commerce system that a company sells goods and services to consumers through an Internet network. The electronic commerce is also called "Internet shopping". When users use an electronic commerce system installed with the virtual fitting system of the embodiment, users are given an advantage that users are prevented from misunderstanding "sense of length" of clothing.

A company managing the electronic commerce service has the following three advantages. The first advantage is that it increases the purchase rate of users, since the service prevents users from leaving the clothing sales web site without finding the size of the clothing that fits the bodies of the users. The second advantage is that it raises the purchase unit price per user, since the user has an opportunity to virtually try on high-priced clothing that the user can not actually try on in the electronic commerce service, and then buy the high-priced clothing. The third advantage is that it reduces the return rate of clothing. The user virtually tries the clothing on. The chance for the user to buy the improper sized clothing is reduced which then reduces the chance that the clothing will be returned.

The Second Embodiment (Processing Flow 2)

Figure 8:
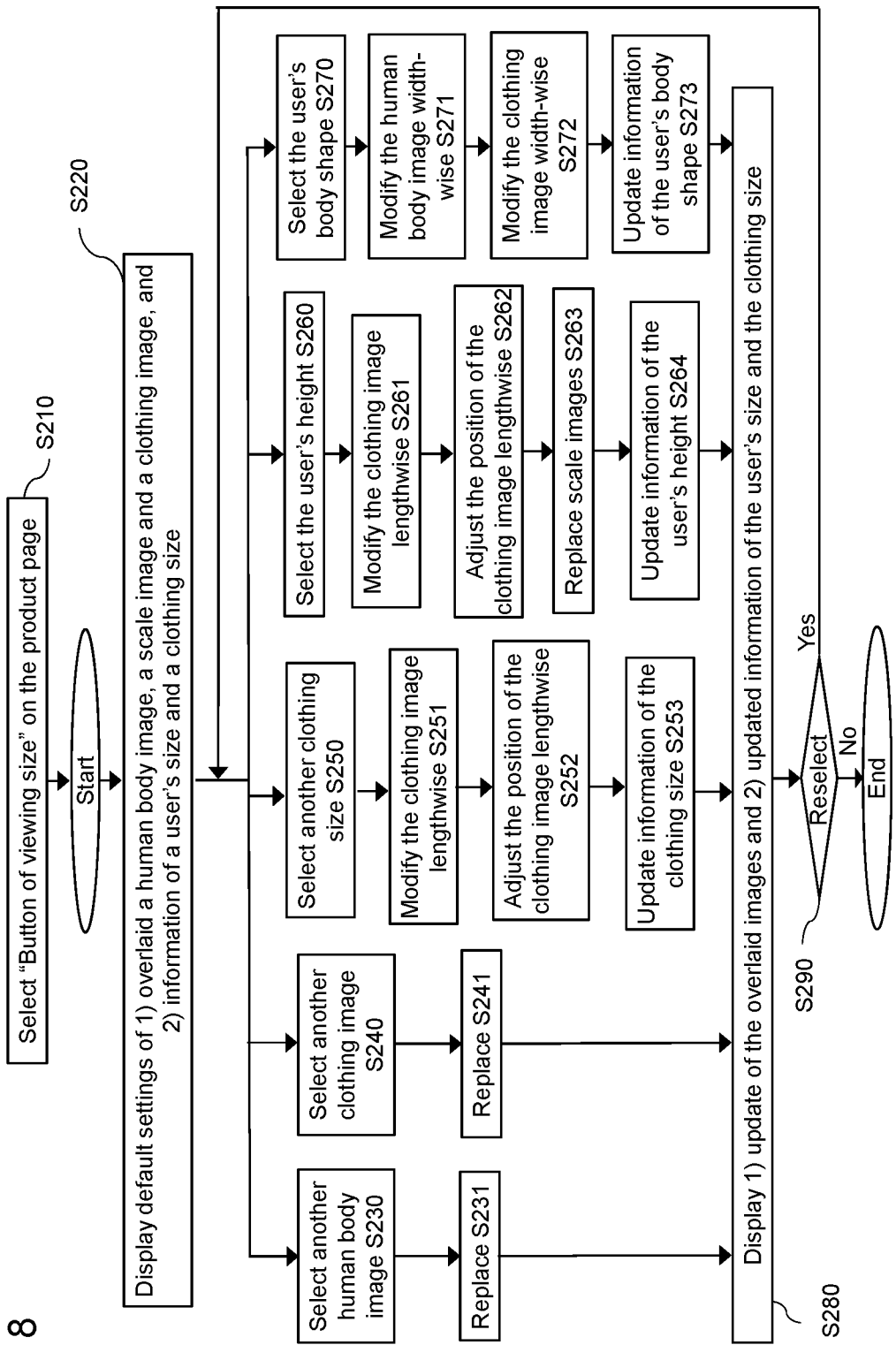
FIG. 8 is a flowchart of processes of the virtual fitting system in accordance with the second embodiment.

FIG. 8 is a flowchart of processes of the virtual fitting system in accordance with the second embodiment. The second embodiment, being different from the first embodiment, describes a process of creating a virtual fitting image, when the clothing image is modified without using the height information of the average human body image. In the second embodiment, even if the height information of the average human body image is changed, the average human body image is not modified lengthwise.

First, the user accesses the website of the virtual fitting system in accordance with the second embodiment and selects the "Button of viewing size" on the product page (not shown) of the clothing that the user wishes to wear (S210). When the user selects a one-piece dress from the clothing, being similar to the first embodiment, the process of creating the virtual fitting image starts.

Processes of the setting unit 310 in the image creation apparatus 300 is described hereinafter, when an outline of female body image is set as a default of the average human body image, shown in FIG. 3. The setting unit 310 acquires "information relating to the average human body image" in the case of an outline of female body image from the human body image DB 420. In the case of the second embodiment, being different from the first embodiment, it may not be necessary that the height information of the average human body be 160 cm.

The setting unit 310 sends the human body image, the scale image, and the clothing image set as default, to the creating unit 330. The creating unit 330 superimposes the human body image, the scale image, and the clothing image on an object-by-object basis to create the virtual fitting image. The virtual fitting image is created by simply superimposing images of each object. Therefore, the virtual fitting image is different from an irreversible composite image.

The image creation unit 330 also creates information for displaying the size information of the user and clothing set as the default by the setting unit 310. The creating unit 330 transmits the virtual fitting image, and information for displaying the default user and clothing size information, to the user device 200. In the user device 200, the display unit 230 displays the virtual fitting image, and the default user and clothing size information, to the user (S220).

The virtual fitting image in which the default human body image, the scale image, and the clothing image are superimposed, is the one-piece dress image and the scale image including the length scale information of the one-piece dress superimposed on the outline of female body image. The default user and clothing size information includes the default height (160 cm), body shape (normal type) height and waist (232-1 in FIG. 3), and the default clothing size (M size) length and waist (232-2 in FIG. 3).

The user selects one or more of processes for updating the images and data of the default settings, using the selecting unit 210 and the receiving unit 220. The S230s (S230 to S231) are update processes when the user selects another human body image. The S240s (S240 to S241) are update processes when the user selects another clothing image. The S250s (S250 to S253) are update processes when the user selects another clothing size. The S260s (S260 to S266) are update processes when the user selects the user's height. The S270s (S270 to S273) are update processes when the user selects the user's body shape.

The information selected by the selecting unit 210 and the receiving unit 220 is sent to the image creation apparatus 300. The image creation apparatus 300 performs each of the update processes. Then, the information of superimposing and displaying the updated human body image, clothing image, and scale image, and the updated user and clothing size information are transmitted to the user device 200. The display unit 230 superimposes and displays the updated human body image, clothing image, and scale image, and displays the updated user's and clothing size information (S280).

The user checks the updated information. When it is necessary for the user to re-select ("Yes" of S290), the user further makes one or more selections (S230, S240, S250, S260 or S270). On the other hand, when it is not necessary for the user to re-select ("No" of S290), the processes of creating the virtual fitting image ends.

Each of the update processes is described. The S230s (S230 to S231) are update processes when the user selects another human body image. The setting unit 310 acquires information relating to a plurality of average human body images from the human body image DB 420 and transmits the information to the user device 200. The selecting unit 210 of the user device 200 displays a plurality of the human body images on a user screen (for example, a website screen) related to the virtual fitting system and prompts the user to select an average human body image that the user wishes to virtually try on.

The user clicks one of the "select model" buttons 222 in FIG. 3 and selects a human body image other than the default female outline image (S230). The information of the human body image selected by the user is transmitted from the receiving unit 220 to the setting unit 310. The setting unit 310 acquires another human body image from the human body image DB 420, based on the information from the receiving unit 220, and exchanges the female outline image for the other human body image (S231).

The S240s (S240 to S241) are update processes when the user selects another clothing image. When the user selects a color for the one-piece dress image other than the "blue" of the default settings by clicking one of the "select color" buttons 225 in FIG. 3 (S240), the setting unit 310 acquires the other color's one-piece dress image from the clothing image DB 410, based on information from the receiving unit 220. The setting unit 310 exchanges the "blue" one-piece dress image for the other color's one-piece dress image (S241).

The S250s (S250 to S253) are update processes when the user selects another clothing size. When the user selects a size of the clothing other than the default M size by clicking one of the "select size" buttons 226 in FIG. 3 (S250), the setting unit 310 transfers the information from the receiving unit 220 to the modifying unit 320. The modifying unit 320 modifies the clothing image lengthwise based on the selected size information (S251). Then, the modifying unit 320 adjusts the modified clothing image lengthwise, to match the shoulder position of the clothing image with the shoulder position of the average human body image (S252). The setting unit 310 updates the "actual sizes of clothing" 232-2 in FIG. 3, using the clothing size information of the clothing image DB 410 (S253).

The S260s (S260 to S264) are update processes when the user selects the user's height. When the user selects a height other than the default 160 cm by using the "select height" button 223 in FIG. 3 (S260), the setting unit 310 transfers the information from the receiving unit 220 to the modifying unit 320.

The modifying unit 320 modifies the clothing image lengthwise based on the difference between the selected height information and the default user's height information (S261). Therefore, if the height selected by the user is taller than the height of the default user, the clothing image is contracted. On the other hand, if the height selected by the user is shorter than the height of the default user, the clothing image is expanded.

As an example, a case where the user selects the user's height as 150 cm is described. When the user selects "150 cm" in "select height" buttons 222 in FIG. 3, the user selects a height of 150 cm, which is 10 cm lower than the default user's height information (height 160 cm).

The default (M size) clothing image is modified lengthwise. The length of the clothing image is multiplied by 1.066667 (=160/150). The reason of the multiplication is below. A distance between the scale lines on the window screen 231 of FIG. 3 is 10 (cm)/160 (cm) when the height of the user is 160 cm, whereas another distance is 10 (cm)/150 (cm) when the height is 150 cm. Therefore, it is necessary to multiply the length of the clothing image by 1.066667 (=160/150).

When the height information changes, the waist may be recalculated by the waist calculation method described above. When the waist is recalculated, the human body image may be laterally modified based on the recalculated waist information.

The modifying unit 320 adjusts the position of the modified clothing image, to match the shoulder position of the modified clothing image with the shoulder position of the average human body image (S262).

The setting unit 310 acquires a new scale image (for 150 cm) from the human body image DB 420 based on the selected height information (150 cm in this case) and replaces the new scale image with the default scale image (S263).

The setting unit 310 also updates "height and body shape" 232-1 in FIG. 3 based on the selected height information (S264). "Height and body shape" 232-1 may be updated by the recalculated waist information.

The S270s (S270 to S273) are update processes when the user selects the user's body shape. When the user selects a waist other than the default 60.8 cm by using the "select waist" button 224 in FIG. 3 as the user's body shape (S270), the setting unit 310 transfers information from the receiving unit 220 to the modifying unit 320. When the user selects another waist except the default 60.8 cm by clicking one of the "select waist" buttons 224 in FIG. 3 as the user's body shape (S270), the setting unit 310 transfers information from the receiving unit 220 to the modifying unit 320.

The modifying unit 320 modifies the average human body image laterally (or width-wise) based on the selected waist information (S271). The modifying unit 320 also modifies the clothing image laterally (or width-wise) based on the selected waist information (S272). The setting unit 310 also updates the waist of "height and body shape" 232-1 in FIG. 3 (S273).

Clothing that can expand and contract lengthwise when the clothing is worn (for example, stockings, leggings, socks, and top that fit the upper part of body) may be expanded or contracted vertically or laterally according to the expanded or contracted human body image.

(Effect 2)

Figure 9:
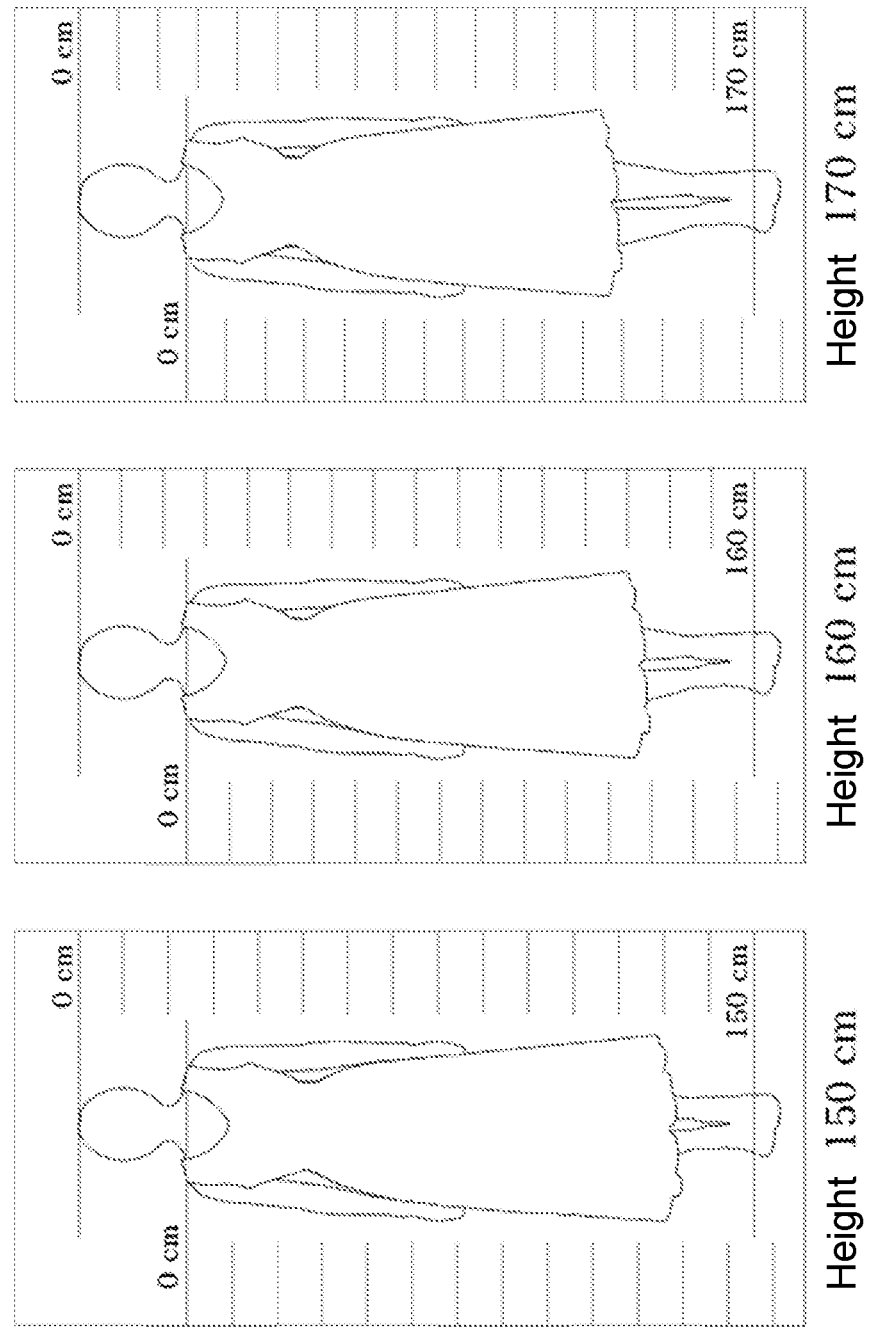
FIG. 9 is a diagram of a result of the processes of the virtual fitting system in accordance with the second embodiment.

FIG. 9 is a diagram of a result of the processes of the virtual fitting system in accordance with the second embodiment. In FIG. 9, the clothing selected by the user is a one-piece dress, the size of the dress is M size, and the length of the dress is 110 cm.

When the height of the average human body image in FIG. 9 (b) is 160 cm, the hem of the dress is around the center of the shin. On the other hand, when the height of the user in FIG. 9 (a) is 150 cm, the hem is lowered to near the ankle. The second embodiment, being similar to the first embodiment, is able to display the "sense of length" when the user virtually wears clothing (such as a dress) of the same size as clothing that a female model or a female mannequin of the human body image virtually wears. A user who is short in stature views the virtual fitting image and can reselect smaller sized clothing.

The size of the human body image displayed in FIG. 9 (a) is the same as the size of the human body image displayed in FIG. 9 (b). The display of FIG. 9 (a) is caused by widening the distance between the scale lines of FIG. 9 (a) more than those of FIG. 9 (b). That is to say, the distance between the height scale lines and the distance between the length scale lines are each of 10 cm. The distances in FIG. 9 (a) are wider than the distances in FIG. 9 (b).

Therefore, even for a user that is short in stature, the virtual fitting image (human body image and clothing image) displayed on the window screen 231 of FIG. 3, being different from the first embodiment, is not contracted. As a result, even a user short in stature can see the virtual fitting image of the second embodiment larger than that of the first embodiment and confirm if the clothing of the size selected by the user fits the user's height.

When the height of the user in FIG. 9 (c) is 170 cm, the hem of the dress rises close to the knee. The embodiment is able to display the "sense of length" when the user virtually wears clothing (such as a dress) of the same size as clothing that a female model or a female mannequin of the human body image virtually wears. A user who is tall in stature views the virtual fitting image and can reselect larger sized clothing.

The size of the human body image displayed in FIG. 9 (c) is the same as the size of the human body image displayed in FIG. 9 (b). The display of FIG. 9 (c) is caused by narrowing the distance between the scale lines of FIG. 9 (c) less than those of FIG. 9 (b). That is to say, the distance between the height scale lines and the distance between the length scale lines are each 10 cm. The distances in FIG. 9 (c) are narrower than the distances in FIG. 9 (b).

As described above, according to the virtual fitting system of the second embodiment, being similar to the first embodiment, the window screen 231 of FIG. 3 displays the virtual fitting image of FIG. 9 modified according to the height of the user. The user can confirm if the clothing of the size that the user selects, fits the user's height. The user is also able to confirm if the design of the length of the clothing fits the user's height.

In the second embodiment, being different from the first embodiment, the size of the human body image does not change, and the scale information changes. In the second embodiment, even if a user is short in stature, the virtual fitting image of the user is not displayed small on the screen, but is displayed on the screen in the same size as the virtual fitting image of another user who is tall in stature. Therefore, it is effective for a short user to confirm if the clothing of the size selected by the short user fits the short user's height.

If a user, being very tall in stature (for example, 180 cm or 190 cm), uses this virtual fitting system, in the case of the first embodiment, it is necessary to design the screen of the system so that such a tall virtual fitting image is included in the entire screen. The design incurs the inconvenience that the virtual fitting image of an average height (for example, 160 cm) needs to be small. However, according to the second embodiment, such an inconvenience does not occur.

Most clothing has properties that the clothing is hard to be modified vertically (even if users' heights are different, the vertical length of the clothing that they wear is almost not changed), while that the clothing is easy to be modified laterally (if users' body shapes such as waists change, the clothing spreads width-wise according to the users' body shapes). The virtual fitting system also has an effect that the modification of the virtual fitting image reflects these properties.

The Third Embodiment

Figure 10:
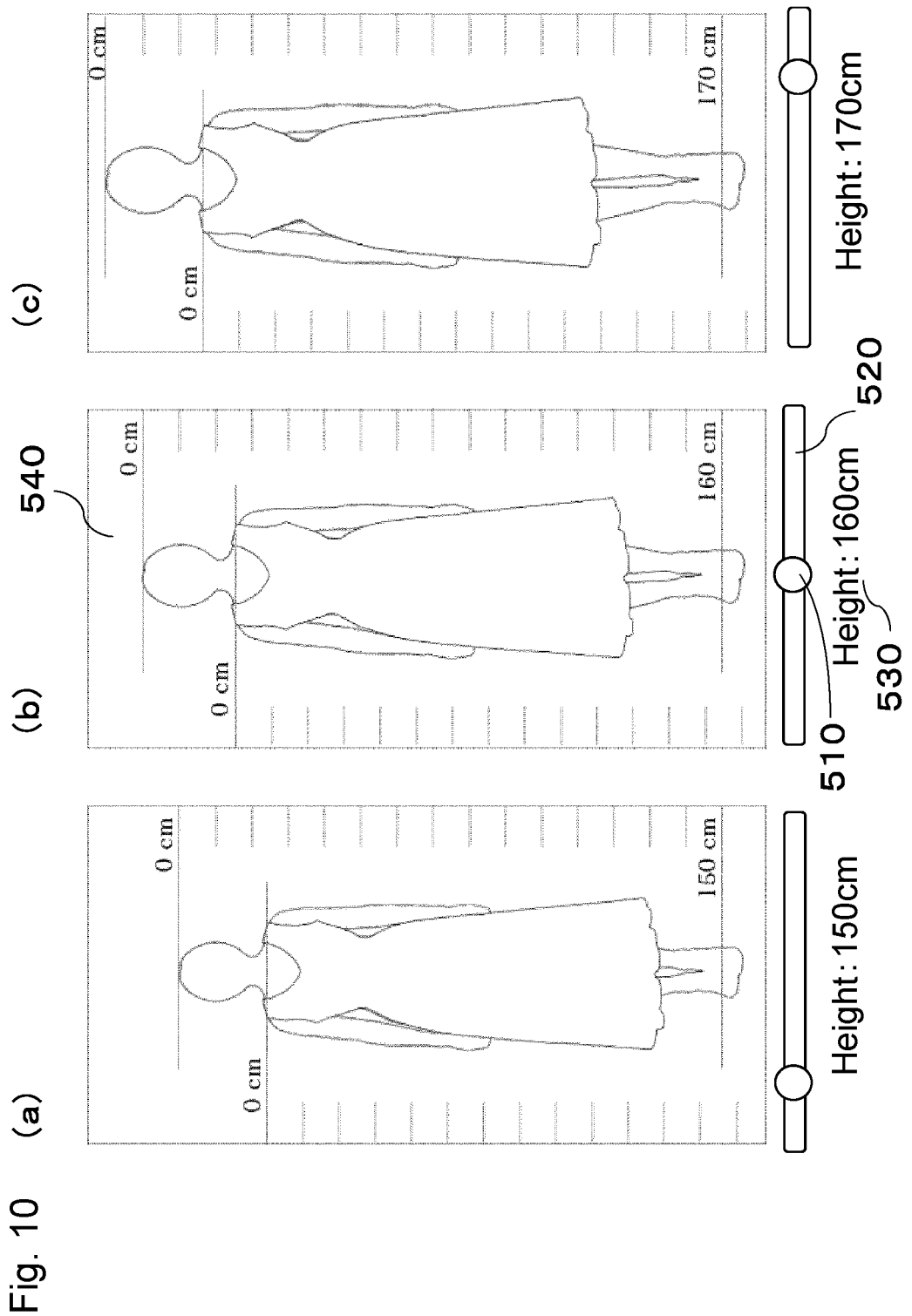
FIG. 10 is a diagram of a result of processes of the virtual fitting system in accordance with the third embodiment (No. 1: Select of a height using a slider).

FIG. 10 is a diagram of a result of processes of the virtual fitting system in accordance with the third embodiment. In the third embodiment, the height of the average human body image is selected by using the slider 510 instead of the "select height" buttons 223 in FIG. 3.

FIGS. 10 (a), (b) and (c) correspond to each of smartphone screens. Each of the smartphone screens includes a slider 510, a slider bar 520, a height window screen 530 and a virtual fitting image window screen 540. The slider 510 is a round mark indicating a current position. The slider bar 520 is a bar-shaped area where the slider 510 can move left and right. The height window screen 530 shows a value of a user's height selected by the user who moves the slider 510 on the slider bar 520. The virtual fitting image window screen 540 displays the virtual fitting image that is the clothing image superimposed on the human body image expanded or contracted based on the selected value of the height.

FIG. 10 (b) shows that the slider 510 is in the center of the slider bar 520 and a height of a user is 160 cm, and that the virtual fitting image of the height is displayed. FIG. 10 (a) shows that the slider 510 is on the left side of the slider bar 520 and a height of a user is selected at 150 cm, and that the virtual fitting image contracted based on the height is displayed. FIG. 10 (c) shows that the slider 510 is on the right side of the slider bar 520 and a height of a user is selected at 170 cm, and that the virtual fitting image expanded based on the height is displayed.

In FIG. 10, each of the waists is changed according to each of the heights, using the method of calculating waists described in FIG. 3. In FIG. 10, the average waist is set at the "normal type", as the default setting.

FIG. 11 is a diagram of a result of processes of the virtual fitting system in accordance with the third embodiment. The difference of FIG. 11 from FIG. 10 is a PC (Personal Computer) screen, for example, a window screen displayed on a Web browser of the PC.

FIG. 11 (*a*) shows a case where a height of a user is 150 cm. FIG. 11 (*b*) shows a case where a height of a user is 170 cm. In FIG. 11, being similar to FIG. 10, the slider 510 on the slider bar 520 is moved to select a height of a user. The selected height is displayed on the height window screen 530. The virtual fitting image window screen 640 displays the virtual fitting image expanded or contracted based on the selected height. The difference of FIG. 11 from FIG. 10 is that a plurality of virtual fitting images are displayed on the virtual fitting image window screen 640. Each of the virtual fitting images is overlaid on each of the different clothing images (a one-piece dress with sleeves or a one-piece dress without sleeves). In FIGS. 11 (*a*) and (*b*), each of two virtual fitting images is displayed. 651 and 652 in FIG. 11 (*a*) correspond to two virtual fitting screens. The display of the two virtual fitting screens is due to the limitation of the drawing. Two or more virtual fitting images may be displayed depending on the size of the screen.

Electronic commerce services, handling clothing sales, usually display product lists (or lists of clothing image data) on the web site screens of the services. The product image list screen (not shown) displays lists of multiple clothing. For example, when users press the "view fitting image" button (not shown) set in the upper right of the screen, the screen is switched to display 1) the slider 510, etc. and 2) the virtual fitting image window screen 640 in which the layout of displaying the product list does not change, as shown in FIG. 11.

Then, when the "Back (or return to product images)" button 660 set on the upper right is pressed, the screen returns to the product image list screen (not shown). Such a transition of screens can introduce the virtual fitting system into the web site of the electronic commerce service, without changing the screen design of the existing product image list on the web site. A similar transition of screens may be performed on the smartphone screen.

Figure 12:
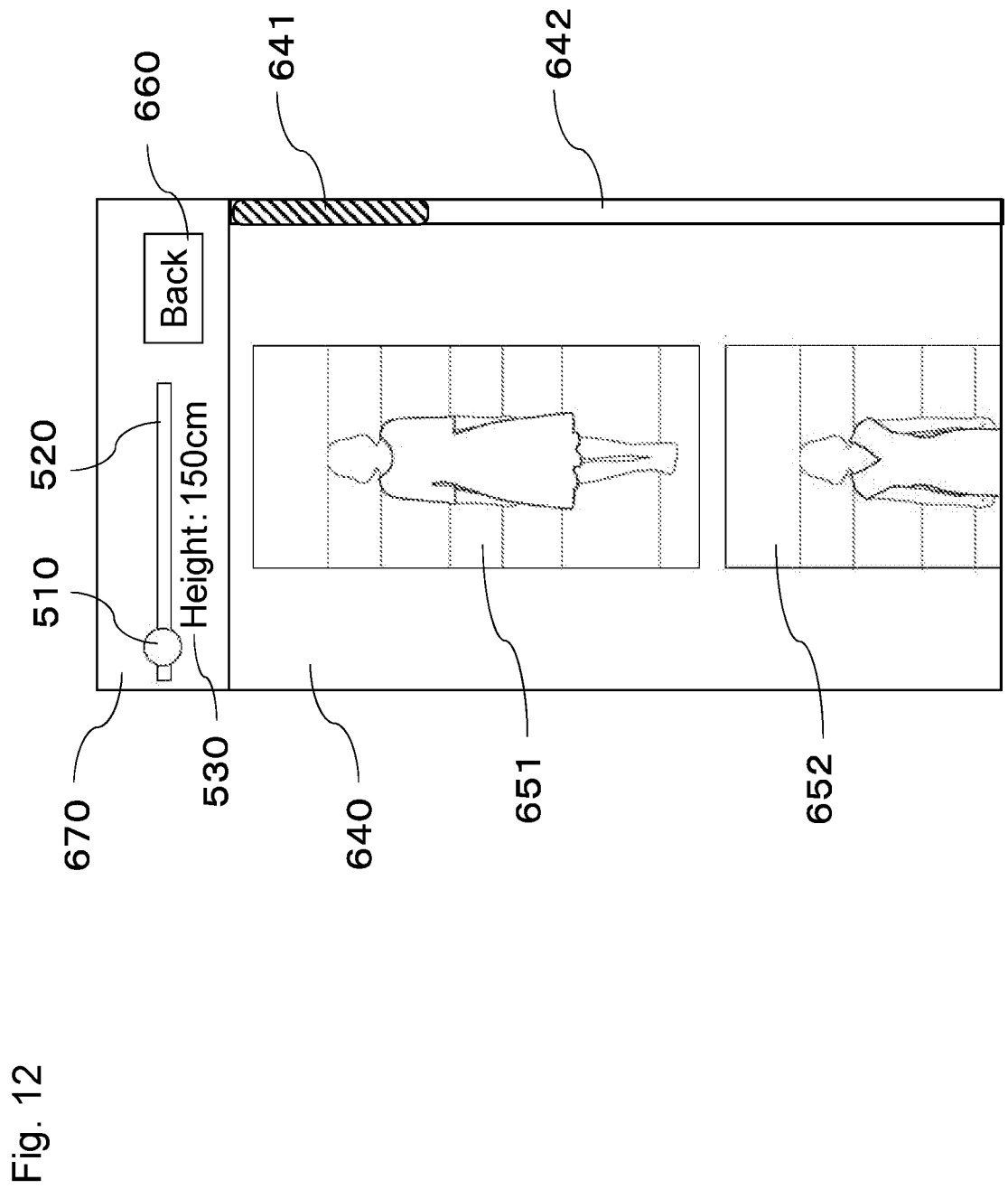
FIG. 12 is a diagram of a result of processes of the virtual fitting system in accordance with the third embodiment (No. 3: Smartphone screen).

FIG. 12 is a diagram of a result of processes of the virtual fitting system in accordance with the third embodiment. The difference of FIG. 12 from FIG. 11 is that the virtual fitting image window screen 640 is scrolled up and down on the web browser of the smartphone screen.

A fixed window screen 670 is set on the virtual fitting image window screen 640. A slider 510, a slider bar 520, a height window screen 530, and a "Back" button 660 are set in the fixed window screen 670. On the other hand, a slider 641 and a slider bar 642 are set on the virtual fitting image window screen 640. The slider 641 is a rectangular mark indicating a current position. The slider bar 642 is a rod-shaped area where the slider 641 moves up and down. The virtual fitting image window screen 640 displays the virtual fitting image 651 and the upper side of the virtual fitting image 652.

The slider 641 and the slider bar 642 may not be always displayed on the smartphone screen. When a user touches the smartphone screen with a finger and moves the screen up and down, the web browser automatically displays the slider 641 and the slider bar 642 according to the move.

Then, when the user wishes to display the lower side of the virtual fitting image 652 which is not displayed in FIG. 12, the user moves the slider 641 down.

(Effect 3)

When a user wishes to select a product on a conventional product image list screen, the user selects a product with a favorite design, color, and length while looking at the image worn by a model with a height different from that of the user on the conventional product image list screen. Then, the user moves to the product detail page, looks up the size and details of the product on the product detail page, and buys the product. For this reason, when the height of the model is different from the height of the user, even if the model fits the length of the product, the user does not always fit the height of the product, and it is difficult for the user to select a product using the conventional product image list screen.

On the other hand, when a virtual fitting system is introduced into the product image list screen, it has an effect that a user can select a product while checking the "sense of length" when the user wears the product.

The Fourth Embodiment

Figure 13:
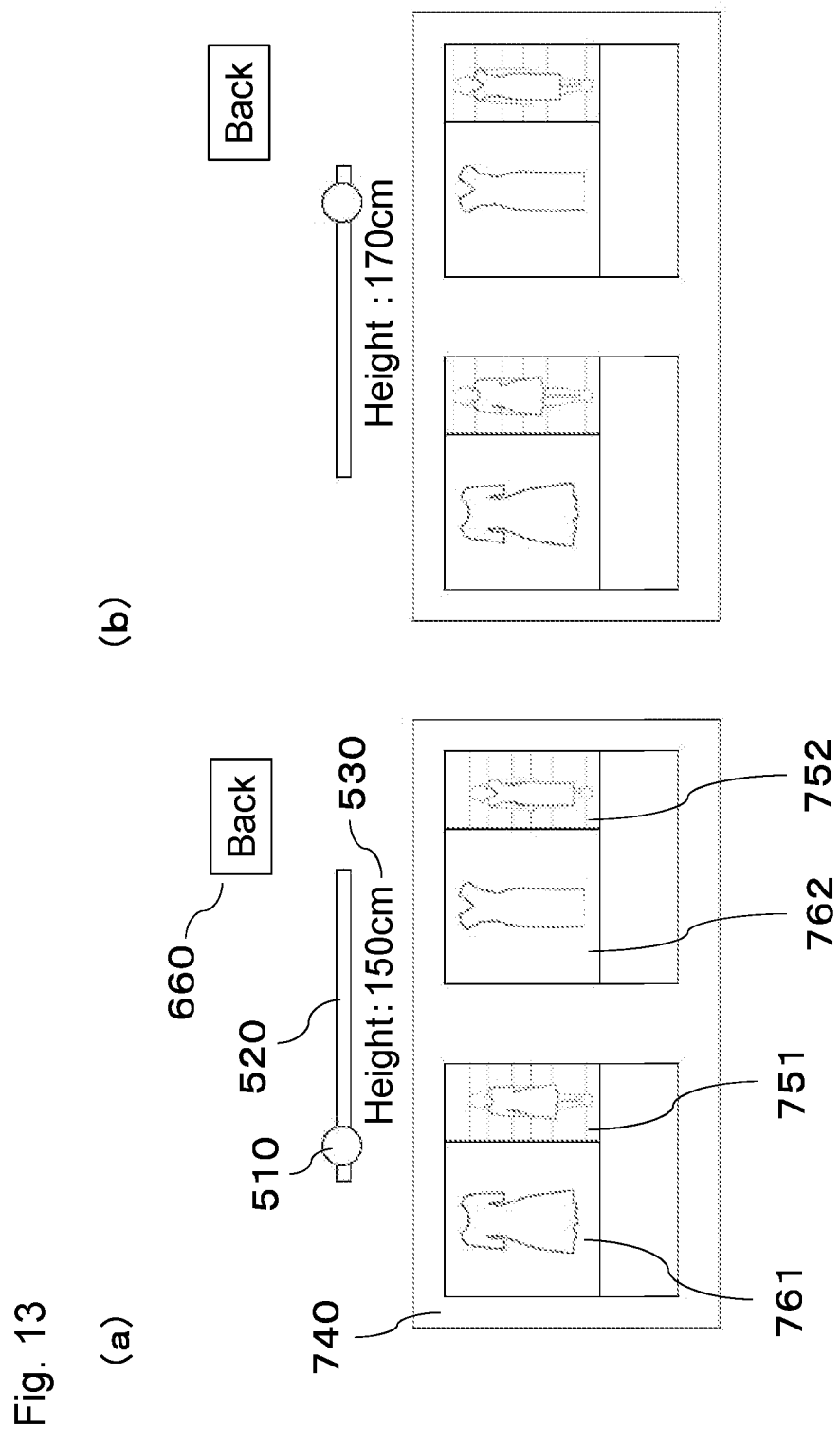
FIG. 13 is a diagram of a result of processes of the virtual fitting system in accordance with the fourth embodiment.

FIG. 13 is a diagram of a result of processes of the virtual fitting system in accordance with the fourth embodiment. FIG. 13 being similar to FIG. 11, shows a PC screen, for example, a window screen displayed on a web browser.

FIG. 13 (*a*) shows a case where the height of a user is 150 cm. FIG. 13 (*b*) shows a case where the height of a user is 170 cm. In FIG. 13, being similarly to FIG. 11, the slider 510 on the slider bar 520 is moved to select a height of a user. The selected height is displayed on the height window screen 530. The virtual fitting image window screen 740 displays a virtual fitting image that has been expanded or contracted based on the selected height. The difference of FIG. 13 from FIG. 11 is that a plurality of virtual fitting images 751 and 752 are displayed on the virtual fitting image window screen 740, and the product images 761 and 762 are also displayed. Two sets of the virtual fitting images and the product images thereof (a set of 751 and 761 and the other set of 752 and 762) are displayed.

The fourth embodiment may be applied to a smartphone screen (not shown). Since smartphone screens are smaller than PC screens, only one set of the virtual fitting image and the product image (for example, 751 and 761 of FIG. 13) may be displayed on the virtual fitting image window screen 740 of FIG. 13.

(Effect 4)

According to the fourth embodiment, an electronic commerce web site selling clothing can provide a user with a screen user interface that allows a user to select a product of the clothing while simultaneously viewing the virtual fitting image and the product image.

Embodiments of the invention are not limited to the description of the examples of the above embodiments. Various modifications are also included in the embodiments of the invention as long as a person skilled in the art can easily conceive without departing from the description of the embodiments.

For example, the embodiments may reflect the difference in clothing sizes (S, M or L). The embodiments may be applied not only to two-dimensional images taken from a front side of the clothing, but also to images taken from the back side or sideways. The embodiments may be applied to three-dimensional images and may also be applied to VR (Virtual Reality) and AR (Augmented Reality).

Although the virtual fitting images are superimposed on an object-by-object basis, after a user determines the image modification according to the embodiments and creates the virtual fitting image, the virtual fitting image may be combined into one image. One image file may be saved in a non-transparent file format, such as, Joint Photographic Experts Group (JPEG) format. The saved files may be used, when a list of a plurality of virtual fitting images (style list or coordination list) is quickly displayed. When a user looks at the displayed list, the user quickly confirms which virtual fitting images suit the user.

Although an embodiment of a smartphone has been described as an example of a mobile information terminal device, the embodiments are not limited to a smartphone, and may be applied to other mobile information terminal devices such as a tablet terminal.

REFERENCE SIGN LIST

100 Virtual fitting system
200 User device
300 Image creation apparatus
400 Image database

The invention claimed is:

1. An image creation apparatus, the apparatus comprising:
a setting unit configured to set a clothing image data that is superimposed on a human body image data, the clothing image data including a clothing image, a size information, and clothing type information of the clothing image, the human body image data including a human body image, a height information, and body shape information of the human body image, and a plurality of reference positions as a guide for placing the clothing image on the human image;
a modifying unit configured to modify the human body image data based on a result of comparing height information of a user with the height information of the human body image data; and
a creating unit configured to superimpose the clothing image data on the human body image data, on an object-by-object basis, based on one of the reference positions dependent on the clothing type information, and to create a virtual fitting image data,
wherein
the reference positions are set at five locations, the five locations being a head, a shoulder, a waist, an inseam, and a sole;
the head, the shoulder, the waist, and the inseam being able to change only lengthwise according to the height information of the human body image data;
when the modifying unit modifies the human body image data based on the result, the reference positions are linked lengthwise to the human body image data, and the clothing image is not modified lengthwise;
the creating unit being further configured to superimpose a scale image on the virtual fitting image data, on the object-by-object basis, the scale image displaying a first scale line having numerical values and distances of scale information of the human body image data, and a second scale line having numerical values and distances of scale information of the clothing image data, the scale information of the clothing image data being scale information from the one reference position.

2. An image creation apparatus, the apparatus comprising:
a setting unit configured to set a clothing image data that is superimposed on a human body image data, the clothing image data including a clothing image, a size information, and clothing type information of the clothing image, the human body image data including a human body image, a height information, and body shape information of the human body image, and a plurality of reference positions as a guide for placing the clothing image on the human image;
a modifying unit configured to modify the human body image data based on a result of comparing height information of a user with the height information of the human body image data; and
a creating unit configured to superimpose the clothing image data on the human body image data, on an object-by-object basis, based on one of the reference positions dependent on the clothing type information, and to create a virtual fitting image data,
wherein
the reference positions are set at five locations, the five locations being a head, a shoulder, a waist, an inseam, and a sole;
the head, the shoulder, the waist, and the inseam being able to change only lengthwise according to the height information of the human body image data;
when the modifying unit modifies the human body image data based on the result, the reference positions are linked lengthwise to the human body image data, and the clothing image is not modified lengthwise;
the creating unit being further configured to superimpose first and second scale lines on the virtual fitting image data, on the object-by-object basis, based on a first and a second scale information, the first scale information being numerical values and distances of scale information of the human body image data, and the second scale information being numerical values and distances of scale information of the clothing image data, the scale information of the clothing image data being scale information from the one reference position.

3. An image creation apparatus, the apparatus comprising:
a setting unit configured to set a clothing image data that is superimposed on the human body image data, the clothing image data including a clothing image, a size information, and clothing type information of the clothing image, the human body image data including a human body image, a height information, and body shape information of the human body image, and a plurality of reference positions as a guide form placing the clothing image on the human image;
a modifying unit configured to modify the clothing image data based on a result of comparing height information of a user with the height information of the human body image data; and
a creating unit configured to superimpose the clothing image data on the human body image data, on an object-by-object basis, based on one of the reference positions dependent on the clothing type information, and to create a virtual fitting image data,
wherein
the reference positions are set at five locations, the five locations being a head, a shoulder, a waist, an inseam, and a sole;
when the modifying unit modifies the clothing image data lengthwise based on the result, the human body image data is not modified lengthwise.

4. The apparatus of any of claims 1-3, wherein
the creating unit is configured to superimpose the clothing data on the human body image data on the object-by-object basis, and generate information for instructing an external device to create the virtual fitting image data.

5. The apparatus of any of claims 1-3, wherein
the modifying unit modifies the clothing image data based on a result of comparing the size information of the clothing image data with the height information or body shape information of the human body image data.

6. The apparatus of claim 3, wherein
the creating unit is further configured to superimpose a scale image on the virtual fitting image data, on the object-by-object basis, the scale image displaying a first scale line having numerical values and distances of scale information of the human body image data, and a second scale line having numerical values and distances of scale information of the clothing image data, the scale information of the clothing image date being scale information from the one reference position.

7. The apparatus of claim 3, wherein
the creating unit is further configured to superimpose first and second scale lines on the virtual fitting image data, on the object-by-object basis, based on a first and a second scale information, the first scale information being numerical values and distances of scale information of the human body image data, and the second scale information being numerical values and distances of scale information of the clothing image data, the scale information of the clothing image data being scale information from the one reference position.

8. The apparatus of any of claims 1-3, wherein the human body image data is a two-dimensional image or a three-dimensional image.

9. The apparatus of any of claims 1-3, wherein the clothing image data is a two-dimensional image or a three-dimensional image.

10. An image creation method using a computer, the method comprising:
a setting step for setting a clothing image data that is superimposed on a human body image data, the clothing image data including a clothing image, a size information, and clothing type information of the clothing image, the human body image data including a human body image, a height information, and body shape information of the human body image, and a plurality of reference positions as a guide for placing the clothing image on the human image;
a modifying step for modifying the human body image data based on a result of comparing height information of a user with the height information of the human body image data; and
a creating step for superimposing the clothing image data on the human body image data, on an object-by-object basis, based on one of the reference positions dependent on the clothing type information, and creating a virtual fitting image data,
wherein
the reference positions are set at five locations, the five locations being a head, a shoulder, a waist, an inseam, and a sole;
the head, the shoulder, the waist, and the inseam being able to change only lengthwise according to the height information of the human body image data;
when the human body image data is modified lengthwise based on the result, the reference positions are linked lengthwise to the human body image data, and the clothing image is not modified lengthwise;
the creating step further superimposing a scale image on the virtual fitting image data, on the object-by-object basis, the scale image displaying a first scale line having numerical values and distances of scale information of the human body image data, and a second scale line having numerical values and distances of scale information of the clothing image data, the scale information of the clothing position.

11. A non-transitory computer-readable storage medium upon which is embodied a sequence of programmed instructions for creating an image which, when executed by a computer, causes the computer to:
set a clothing image data that is superimposed on a human body image data, the clothing image data including a clothing image, a size information, and clothing type information of the clothing image, the human body image data including a human body image, a height information, and body shape information of the human body image, and a plurality of reference position as a guide for placing the clothing image on the human image;
modify the human body image data based on a result of comparing height information of a user with the height information of the human body image data; and
superimpose the clothing image data on the human body image data, on an object-by-object basis, based on one of the reference positions dependent on the clothing type information, and creating a virtual fitting image data,
wherein
the reference positions are set at five locations, the five locations being a head, a shoulder, a waist, an inseam, and a sole;
the head, the shoulder, the waist, and the inseam being able to change only lengthwise according to the height information of the human body image data;
when the human body image data is modified lengthwise based on the result, the reference positions are linked lengthwise to the human body image data, and the clothing image is not modified lengthwise;
the computer being further caused to superimpose a scale image on the virtual fitting image data, on the object-by-object basis, the scale image displaying a first scale line having numerical values and distances of scale information of the human body image data, and a second scale line having numerical values and distances of scale information of the clothing image data, the scale information of the clothing image data being scale information from the one reference position.

12. A virtual fitting system, the system comprising:
a setting unit configured to set a clothing image data that is superimposed on a human body image data, the clothing image data including a clothing image, a size information, and clothing type information of the clothing image, the human body image data including a human body image, a height information, and body shape information of the human body image, and a plurality of reference positions as a guide for placing the clothing image on the human image;
a modifying unit configured to modify the human body image data based on a result of comparing height information of a user with the height information of the human body image data;
a creating unit configured to superimpose the clothing image data on the human body image data, on an object-by-object basis, based on one of the reference positions dependent on the clothing type information, and create a virtual fitting image data; and
a displaying unit configured to display the virtual fitting image data,
wherein
the reference positions are set at five locations, the five locations being a head, a shoulder, a waist, an inseam and a sole;

the head, the shoulder, the waist, and the inseam being able to change only lengthwise according to the height information of the human body image data;
when the modifying unit modifies the human body image data based on the result, the reference positions are linked lengthwise to the human body image data, and the clothing image is not modified lengthwise; and
the creating unit further configured to superimpose a scale image on the virtual fitting image data, on the object-by-object basis, the scale image displaying a first scale line having numerical values and distances of scale information of the human body image data, and a second scale line having numerical values and distances of scale information of the clothing image data, the scale information of the clothing image data being scale information from the one reference position.

13. An image creation method using a computer, the method comprising:
a setting step for setting a clothing image data that is superimposed on a human body image data, the clothing image data including a clothing image, a size information, and clothing type information of the clothing image, the human body image data including a human body image, a height information, and body shape information of the human body image, and a plurality of reference positions as a guide for placing the clothing image on the human image;
a modifying step for modifying the human body image data based on a result of comparing height information of a user with the height information of the human body image data; and
a creating step for superimposing the clothing image data on the human body image data, on an object-by-object basis, based on one of the reference positions dependent on the clothing type information, and creating a virtual fitting image data,
wherein
the reference positions are set at five locations, the five locations being a head, a shoulder, a waist, an inseam, and a sole;
the head, the shoulder, the waist, and the inseam being able to change only lengthwise according to the height information of the human body image data;
when the human body image data is modified lengthwise based on the result, the reference positions are linked lengthwise to the human body image data, and the clothing image is not modified lengthwise;
the creating step further superimposing first and second scale lines on the virtual fitting image data, on the object-by-object basis, based on a first and a second scale information, the first scale information being numerical values and distances of scale information of the human body image data, and the second scale information being numerical values and distances of scale information of the clothing image data, the scale information of the clothing image data being scale information from the one reference position.

14. An image creation method using a computer, the method comprising:
setting a clothing image data that is superimposed on a human body image data, the clothing image data including a clothing image, a size information, and clothing type information of the clothing image, the human body image data including a human body image, a height information, and body shape information of the human body image, and a plurality of reference positions as a guide for placing the clothing image on the human image;
modifying the clothing image data based on a result of comparing height information of a user with the height information of the human body image data; and
superimposing the clothing image data on the human body image data, on an object-by-object basis, based on one of the reference positions dependent on the clothing type information, and to create a virtual fitting image data,
wherein
the reference positions are set at five locations, the five locations being a head, a shoulder, a waist, an inseam, and a sole;
when the clothing image data is modified lengthwise based on the result, the human body image data is not modified lengthwise.

15. A non-transitory computer-readable storage medium upon which is embodied a sequence of programmed instructions for creating an image which, when executed by a computer, causes the computer to:
set a clothing image data that is superimposed on a human body image data, the clothing image data including a clothing image, a size information, and clothing type information of the clothing image, the human body image data including a human body image, a height information, and body shape information of the human body image, and a plurality of reference positions as a guide for placing the clothing image on the human image;
modify the human body image data based on a result of comparing height information of a user with the height information of the human body image data; and
superimpose the clothing image data on the human body image data, on an object-by-object basis, based on one of the reference positions dependent on the clothing type information, and creating a virtual fitting image data,
wherein
the reference positions are set at five locations, the five locations being a head, a shoulder, a waist, an inseam, and a sole;
the head, the shoulder, the waist, and the inseam being able to change only lengthwise according to the height information of the human body image data;
when the human body image data is modified lengthwise based on the result, the reference positions are linked lengthwise to the human body image data, and the clothing image is not modified lengthwise;
the computer being further caused to superimpose first and second scale lines on the virtual fitting image data, on the object-by-object basis, based on a first and a second scale information, the first scale information being numerical values and distances of scale information of the human body image data, and the second scale information being numerical values and distances of scale information of the clothing image data, the scale information of the clothing image data being scale information from the one reference position.

16. A non-transitory computer-readable storage medium upon which is embodied a sequence of programmed instructions for creating an image which, when executed by a computer, causes the computer to:
set a clothing image data that is superimposed on a human body image data, the clothing image data including a clothing image, a size information, and clothing type information of the clothing image, the human body image data including a human body image, a height information, and body shape information of the human body image, and a plurality of reference positions as a guide for placing the clothing image on the human image;

modify the clothing image data based on a result of comparing height information of a user with the height information of the human body image data; and superimpose the clothing image data on the human body image data, on an object-by-object basis, based on one of the reference positions dependent on the clothing type information, and to create a virtual fitting image data, wherein the reference positions are set at five locations, the five locations being a head, a shoulder, a waist, an inseam, and a sole;

when the clothing image data is modified lengthwise based on the result, the human body image data is not modified lengthwise.

17. A virtual fitting system, the system comprising:

a setting unit configured to set a clothing image data that is superimposed on a human body image data, the clothing image data including a clothing image, a size information, and clothing type information of the clothing image, the human body image data including a human body image, a height information, and body shape information of the human body image, and a plurality of reference positions as a guide for placing the clothing image on the human image;

a modifying unit configured to modify the human body image data based on a result of comparing height information of a user with the height information of the human body image data;

a creating unit configured to superimpose the clothing image data on the human body image data, on an object-by-object basis, based on one of the reference positions dependent on the clothing type information, and create a virtual fitting image data; and a displaying unit configured to display the virtual fitting image data, wherein the reference positions are set at five locations, the five locations being a head, a shoulder, a waist, an inseam, and a sole;

the head, the shoulder, the waist, and the inseam being able to change only lengthwise according to the height information of the human body image data;

when the modifying unit modifies the human body image data lengthwise based on the result, the reference positions are linked lengthwise to the human body image data, and the clothing image is not modified lengthwise; and the creating unit is further configured to superimpose first and second scale lines on the virtual fitting image data, on the object-by-object basis, based on a first and a second scale information, the first scale information being numerical values and distances of scale information of the human body image data, and the second scale information being numerical values and distances of scale information of the clothing image data, the scale information of the clothing image data being scale information from the one reference position.

18. A virtual fitting system, the system comprising:

a setting unit configured to set a clothing image data that is superimposed on a human body image data, the clothing image data including a clothing image, a size information, and clothing type information of the clothing image, the human body image data including a human body image, a height information, and body shape information of the human body image, and a plurality of reference positions as a guide for placing the clothing image on the human image;

a modifying unit configured to modify the clothing image data based on a result of comparing height information of a user with the height information of the human body image data;

a creating unit configured to superimpose the clothing image data on the human body image data, on an object-by-object basis, based on one of the reference positions dependent on the clothing type information, and create a virtual fitting image data; and a displaying unit configured to display the virtual fitting image data, wherein the reference positions are set at five locations, the five locations being a head, a shoulder, a waist, an inseam, and a sole;

when the modifying unit modifies the clothing image data lengthwise based on the result, the human body image data is not modified lengthwise.

19. The system of any of claims 12, 17-18, wherein the displaying unit switches and displays the clothing image data and the virtual fitting image data.

20. The system of any of claims 12, 17-18, wherein the displaying unit displays a set of the clothing image data and the virtual fitting image data.

* * * * *